United States Patent
Saito et al.

(10) Patent No.: US 6,806,804 B2
(45) Date of Patent: Oct. 19, 2004

(54) MAGNETIC DETECTING ELEMENT HAVING β-VALUES SELECTED FOR FREE MAGNETIC LAYER AND PINNED MAGNETIC LAYER

(75) Inventors: Masamichi Saito, Niigata-ken (JP); Yosuke Ide, Niigata-ken (JP); Naoya Hasegawa, Niigata-ken (JP)

(73) Assignee: Alps Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/641,538

(22) Filed: Aug. 14, 2003

(65) Prior Publication Data

US 2004/0041679 A1 Mar. 4, 2004

(30) Foreign Application Priority Data

Aug. 29, 2002 (JP) .................................. 2002-250658

(51) Int. Cl.⁷ ................................................ H01F 5/00
(52) U.S. Cl. .................. 336/200; 360/113; 360/324.12; 336/232
(58) Field of Search .................................. 336/200, 223, 336/232; 360/113, 324.12; 29/602.1

(56) References Cited

U.S. PATENT DOCUMENTS

| 5,287,238 A | 2/1994 | Baumgart et al. |
| 6,118,624 A | 9/2000 | Fukuzawa et al. |
| 2002/0150791 A1 | 10/2002 | Yuasa et al. |

FOREIGN PATENT DOCUMENTS

| JP | 6-223336 | 8/1994 |
| JP | 8-504303 | 5/1996 |

*Primary Examiner*—Lincoln Donovan
*Assistant Examiner*—Jennifer A. Poker
(74) *Attorney, Agent, or Firm*—Brinks Hofer Gilson & Lione

(57) ABSTRACT

The present invention provides a spin valve magnetic detecting element having large ΔR. The positive or negative sign of the β value of a magnetic material constituting each of a first free magnetic sub-layer, a second free magnetic sub-layer and a pinned magnetic layer is defined so that the resistance values for spin-up conduction electrons are smaller than the resistance values for spin-down conduction electrons in all magnetic layers when magnetization of a free magnetic layer is changed to minimize the resistance value. In this case, the change ΔR in resistance of the magnetic detecting element can be increased.

27 Claims, 9 Drawing Sheets

FIG. 8

| | CASE 1 | | CASE 2 | |
|---|---|---|---|---|
| | β | γ | β | γ |
| 89 ← | + | | − | |
| 88 {93, 92} | | + | | − |
| | | − | | + |
| 87 → | − | | + | |
| | | − | | + |
| 86 {91, 90} | | + | | − |
| 85 ← | + | | − | |
| | | + | | − |
| 25 {41, 40} | | − | | + |
| 52 → | − | | + | |

FIG. 9

| | CASE 3 | | CASE 4 | |
|---|---|---|---|---|
| | β | γ | β | γ |
| 89 → | − | | + | |
| 88 {93, 92} | | − | | + |
| | | + | | − |
| 87 ← | + | | − | |
| | | + | | − |
| 86 {91, 90} | | − | | + |
| 85 → | − | | + | |
| 25 | | − | | + |
| 52 → | − | | + | |

MAGNETIC DETECTING ELEMENT HAVING β-VALUES SELECTED FOR FREE MAGNETIC LAYER AND PINNED MAGNETIC LAYER

BACKGROUND OF THE INVENTION

1. Field of the Invention

The present invention relates to a spin valve magnetic detecting element, and particularly to a magnetic detecting element capable of effectively improving a change ΔR in resistance.

2. Description of the Related Art

FIG. 10 is a sectional view showing a conventional magnetic detecting element.

The spin valve magnetic detecting element shown in FIG. 10 comprises a multilayer film 6 comprising an antiferromagnetic layer 2, a pinned magnetic layer 3, a nonmagnetic material layer 4, and a synthetic ferrimagnetic free magnetic layer 5 including a first free magnetic sub-layer 5a, a nonmagnetic intermediate layer 5b, and a second free magnetic sub-layer 5c, which are laminated in that order from the bottom. The spin valve magnetic detecting element further comprises electrode layers 1 and 7 formed below and above the multilayer film 6, hard bias layer 8 formed on both sides of the free magnetic layer 5, insulating layers 9 formed below the respective hard bias layers 8, and insulating layers 10 formed on the respective hard bias layers 8.

The antiferromagnetic layer 2 is made of PtMn, and each of the pinned magnetic layer 3, and the first and second free magnetic sub-layers 5a and 5c of the free magnetic layer 5 is made of CoFe, the nonmagnetic intermediate layer 5b of the free magnetic layer 5 is made of Ru, the nonmagnetic material layer 4 is made of Cu, each of the hard bias layers 8 is made of a hard magnetic material such as CoPt or the like, each of the insulating layers 9 and 10 is made of alumina, and each of the electrode layers 1 and 7 is made of an electrically conductive material.

The magnetic detecting element shown in FIG. 10 is referred to as a "spin valve magnetic detecting element", for detecting a recording magnetic field from a recording medium such as a hard disk or the like.

The magnetic detecting element shown in FIG. 10 is a CPP (current perpendicular to the plane) type magnetic detecting element in which a current flows perpendicularly to the film plane of each of the layers of the multilayer film 6.

The magnetization direction of the pinned magnetic layer 3 is pinned in the Y direction shown in the drawing. For example, when the magnetic thickness (saturation magnetization Ms×thickness t) of the second free magnetic sub-layer 5c is larger than that of the first free magnetic sub-layer 5a, the magnetization direction of the second free magnetic sub-layer 5c with no external magnetic field applied thereto is oriented in the track width direction (the X direction shown in the drawing) and put into a single magnetic domain state by a longitudinal bias magnetic field from each hard bias layer 8. On the other hand, the magnetization direction of the first free magnetic sub-layer 5a is oriented antiparallel to the track width direction. The magnetization direction of the whole free magnetic layer 5 coincides with the magnetization direction of the second free magnetic sub-layer 5c having a larger magnetic thickness. With an external magnetic field applied, magnetizations of the first and second free magnetic sub-layers 5a and 5c rotate while maintaining a synthetic ferrimagnetic state to change the electric resistance of the multilayer film 6. The change in the electric resistance is taken as a change in voltage or a change in current to detect the external magnetic field.

When a current flows through a magnetic material, the magnetic material has different values of resistivity for majority conduction electrons and for minority conduction electrons.

In the magnetic material, the magnetic moment of a constituent magnetic atom is mainly defined by the orbital magnetic moment and spin magnetic moment of a 3d-or 4f-orbit electron. Basically, the number of 3d-or 4f-orbit spin-up electrons is different from the number of 3d-or 4f-orbit spin-down electrons. Of the 3d- or 4f-orbit spin-up electrons and spin-down electrons, the spin of a larger number of the electrons is referred to as a "majority spin", and the spin of a smaller number of the electrons is referred to as a "minority spin".

On the other hand, a current flowing through the magnetic material contains substantially the same number of spin-up and spin-down conduction electrons. Of the spin-up and spin-down conduction electrons, the conduction electrons having the same spin as the majority spin of the magnetic material are referred to as "majority conduction electrons", and the conduction electrons having the same spin as the minority spin are referred to as "minority conduction electrons".

Assuming that a resistivity value of a magnetic material for the minority conduction electrons is $\rho\downarrow$, and a resistivity value for the majority conduction electrons is $\rho\uparrow$, a β value inherent to the magnetic material can be defined by the following relational expression:

$$\rho\downarrow/\rho\uparrow = (1+\beta)/(1-\beta) \quad (-1 \leq \beta \leq 1)$$

Namely, when the β value of the magnetic material is positive (β>0), $\rho\downarrow > \rho\uparrow$ is established, and thus the majority conduction electrons easily flow through the magnetic material. On the other hand, when the β value of the magnetic material is negative (β<0), $\rho\downarrow < \rho\uparrow$ is established, and thus the minority conduction electrons easily flow through the magnetic material.

In a laminate of a magnetic layer made of a magnetic material and a nonmagnetic layer made of a nonmagnetic material, an interface resistance occurs at the interface between the magnetic layer and the nonmagnetic layer.

The interface resistance also shows different values for the majority conduction electrons and the minority conduction electrons.

Assuming that the interface resistance value for the minority conduction electrons is $r\downarrow$, and the interface resistance value for the majority conduction electrons is $r\uparrow$, a γ value inherent to a combination of a magnetic material and a nonmagnetic material can be defined by the following relational expression:

$$r\downarrow/r\uparrow = (1+\gamma)/(1-\gamma) \quad (-1 \leq \gamma \leq 1)$$

Namely, when the γ value is positive (γ>0), $r\downarrow > r\uparrow$ is established, and thus the majority conduction electrons easily flow at the interface. On the other hand, when the y value is negative (γ<0), $r\downarrow < r\uparrow$ is established, and thus the minority conduction electrons easily flow at the interface.

In the magnetic detecting element shown in FIG. 10, the pinned magnetic layer 2, and the first and second free magnetic sub-layers 5a and 5c are made of magnetic materials CoFe having the same composition. CoFe shows a positive β value. Namely, the majority conduction electrons easily flow through each of the pinned magnetic layer 2 and the first and second free magnetic sub-layers 5a and 5c.

The nonmagnetic material layer 4 is made of Cu. Also, both the interface between the nonmagnetic material layer 4 and the pinned magnetic layer 3 and the interface between the nonmagnetic material layer 4 and the first free magnetic sub-layer 5a show positive γ values.

The nonmagnetic intermediate layer 5b is made of Ru. Also, both the interface between the first free magnetic sub-layer 5a and the nonmagnetic intermediate layer 5b and the interface between the second free magnetic sub-layer 5c and the nonmagnetic intermediate layer 5b show negative γ values.

FIG. 11 shows a relation between β and γ values and each magnetic layer. FIG. 11 schematically shows the layers related to the magnetoresistive effect of the magnetic detecting element shown in FIG. 10. In FIG. 11, the magnetization direction of each of the pinned magnetic layer 3 and the first and second free magnetic sub-layers 5a and 5c is shown by an arrow. The majority spin of the electrons related to magnetization of a magnetic layer showing a rightward magnetization direction in the drawing is spin up, and the majority spin of the electrons related to magnetization of a magnetic layer showing a leftward magnetization direction in the drawing is spin down. Magnetization of each of the first and second free magnetic sub-layers 5a and 5c is oriented in a direction in which the resistance value of the magnetic detecting element becomes minimum.

In order to increase the change ΔR in resistance of the magnetic detecting element, when the magnetization of the free magnetic layer 5 is oriented in the direction shown by an arrow in FIG. 11, the resistance values for the spin-up conduction electrons are preferably lower than the resistance values for the spin-down conduction elections in all magnetic layers, and the interface resistance values for the spin-up conduction electrons are preferably lower than the interface resistance values for the spin-down conduction electrons at the interfaces between the all magnetic layers and the nonmagnetic material layers (the nonmagnetic material layer 4 and the nonmagnetic intermediate layer 5b). Alternatively, the resistance values for the spin-down conduction electrons are preferably lower than the resistance values for the spin-up conduction elections in all magnetic layers, and the interface resistance values for the spin-down conduction electrons are preferably lower than the interface resistance values for the spin-up conduction electrons at the interfaces between the all magnetic layers and the nonmagnetic material layers (the nonmagnetic material layer 4 and the nonmagnetic intermediate layer 5b).

Referring to FIG. 11, in each of the pinned magnetic layer 3 and the first free magnetic sub-layer 5a in which the majority spin is spin up, and β>0, the resistance value for the spin-up conduction electrons is low, while in the second free magnetic sub-layer 5c in which the majority spin is spin down, and β>0, the resistance value for the spin-up conduction electrons is high.

Also, at the interface between the nonmagnetic material layer 4 and the pinned magnetic layer 3, the interface between the nonmagnetic material layer 4 and the first free magnetic sub-layer 5a, and the interface between the nonmagnetic intermediate layer 5b and the second free magnetic sub-layer 5c, the interface resistance for the spin-up conduction electrons is lower than that for the spin-down conduction electrons. However, at the interface between the first free magnetic sub-layer 5a and the nonmagnetic intermediate layer 5b, the interface resistance for the spin-up conduction electrons is higher than that for the spin-down conduction electrons.

In this way, the conventional magnetic detecting element has a low efficiency of flow control of conduction electrons.

SUMMARY OF THE INVENTION

The present invention has bees achieved for solving the problem of the above-described conventional magnetic detecting element, and an object of the present invention is to provide a magnetic detecting element capable of increasing a difference between ease of a conduction electron flow under a low resistance condition and ease of a conduction electron flow under a high resistance condition to increase a change ΔR in resistance.

A magnetic detecting element of the present invention comprises a multilayer film comprising an antiferromagnetic layer, a pinned magnetic layer, a nonmagnetic material layer and a free magnetic layer, which are laminated in that order, the free magnetic layer including a first free magnetic sub-layer and a second free magnetic sub-layer laminated on the first free magnetic sub-layer with a nonmagnetic intermediate layer provided therebetween, wherein the β value of a magnetic material constituting the first free magnetic sub-layer has a positive or negative sign which is the same as that of the pinned magnetic layer and different from that of the second free magnetic sub-layer, or the β value of a magnetic material constituting the second free magnetic sub-layer has a positive or negative sign which is the same as that of the pinned magnetic layer and different from that of the first free magnetic sub-layer.

However, the β value is inherent to a magnetic material satisfying the relational expression, $\rho\downarrow/\rho\uparrow=(1+\beta)/(1-\beta)$ ($-1\leq\beta\leq1$) (wherein $\rho\downarrow$ is a resistivity value for the minority conduction electrons, and $\rho\uparrow$ is a resistivity value for the majority conduction electrons).

A magnetic detecting element of the present invention comprises a multilayer film comprising an antiferromagnetic layer, a pinned magnetic layer, a nonmagnetic material layer and a free magnetic layer, which are laminated in that order, the pinned magnetic layer including a first pinned magnetic sub-layer and a second pinned magnetic sub-layer laminated on the first pinned magnetic sub-layer with a nonmagnetic intermediate layer provided therebetween, wherein the β value of a magnetic material constituting the second pinned magnetic sub-layer has a positive or negative sign which is the same as that of the free magnetic layer and different from that of the first pinned magnetic sub-layer, or the β value of a magnetic material constituting the first pinned magnetic sub-layer has a positive or negative sign which is the same as that of the free magnetic layer and different from that of the second pinned magnetic sub-layer.

A magnetic detecting element of the present invention comprises a multilayer film comprising an antiferromagnetic layer, a pinned magnetic layer, a nonmagnetic material layer and a free magnetic layer, which are laminated in that order, the free magnetic layer including a first free magnetic sub-layer, a nonmagnetic intermediate layer, a second free magnetic sub-layer, a nonmagnetic intermediate layer and a third free magnetic sub-layer, which are laminated in that order, wherein the β value of a magnetic material constituting the first free magnetic sub-layer has a positive or negative sign which is the same as those of the third free magnetic sub-layer and the pinned magnetic layer and different from that of the second free magnetic sub-layer, or the β value of a magnetic material constituting the second free magnetic sub-layer has a positive or negative sign which is the same as that of the pinned magnetic layer and different from those of the first free magnetic sub-layer and the third free magnetic sub-layer.

In the present invention, if the β value of the magnetic material constituting each of the free magnetic layer (the first free magnetic sub-layer, the second free magnetic sub-layer and the third free magnetic sub-layer) and the pinned magnetic layer (the first pinned magnetic sub-layer and the second pinned magnetic sub-layer) (these layers are simply referred to as the "magnetic layers") is defined, when magnetization of the free magnetic layer is changed to minimize the resistance value, the resistance values for the spin-up conduction electrons are lower than the resistance values for the spin-down conduction electrons in all magnetic layers, or the resistance values for the spin-down conduction electrons are lower than the resistance values for the spin-up conduction electrons in all magnetic layers, thereby increasing the change ΔR in resistance of the magnetic detecting element.

In the present invention, the γ value at the interface between the first free magnetic sub-layer, the second free magnetic sub-layer, the third free magnetic sub-layer, the first pinned magnetic sub-layer or the second pinned magnetic sub-layer and the nonmagnetic intermediate layer or the nonmagnetic intermediate layer preferably has the same positive or negative sign as that of the β value of the magnetic layer in contact with the interface.

However, the γ value is inherent to an interface satisfying the relational expression, $r\downarrow/r\uparrow=(1+\gamma)/(1-\gamma)(-1\leq\gamma\leq1)$ (wherein $r\downarrow$ is the interface resistance value for the minority conduction electrons, and $r\uparrow$ is the interface resistance value for the majority conduction electrons).

In the present invention, if the γ value is defined, when magnetization of the free magnetic layer of the spin valve magnetic detecting element is changed to minimize the resistance value, the interface resistance values for the spin-up conduction electrons are lower than the interface resistance values for the spin-down conduction electrons at the interfaces between all magnetic layers and the nonmagnetic material layers (the nonmagnetic material layer and the nonmagnetic intermediate layers), or the interface resistance values for the spin-down conduction electrons are lower than the interface resistance values for the spin-up conduction electrons at all interfaces, thereby increasing the change ΔR in resistance of the magnetic detecting element.

In order to define the γ value as described above, in some cases, the positive or negative sign of the γ value at the interface between the magnetic layer and the top of the nonmagnetic material layer or the nonmagnetic intermediate layer must be differentiated from that at the interface between the magnetic layer and the bottom of the nonmagnetic material layer or the nonmagnetic intermediate layer. However, in the present invention, the nonmagnetic material layer and/or the nonmagnetic intermediate layer is formed in a two-layer structure comprising different nonmagnetic materials, for solving the problem of this necessity.

A magnetic detecting element of the present invention comprises a multilayer film comprising an antiferromagnetic layer, a pinned magnetic layer, a nonmagnetic material layer and a free magnetic layer, which are laminated in that order, the free magnetic layer including a first free magnetic sub-layer and a second free pinned magnetic layer laminated on the first free magnetic sub-layer with a nonmagnetic intermediate layer provided therebetween, wherein assuming that a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn) is an alloy belonging to an A group, and a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and W) is an alloy belonging to a B group, a magnetic material constituting the first free magnetic sub-layer comprises an alloy belonging to the A or B group which is the same as that of the pinned magnetic layer and different from that of the second free magnetic sub-layer, or a magnetic material constituting the second free magnetic sub-layer comprises an alloy belonging to the A or B group which is the same as that of the pinned magnetic layer and different from that of the first free magnetic sub-layer.

In the magnetic detecting element of the present invention, the pinned magnetic layer may comprise a first pinned magnetic sub-layer, and a second pinned magnetic sub-layer laminated on the first pinned magnetic sub-layer with a nonmagnetic intermediate layer provided therebetween, wherein a magnetic material constituting the second pinned magnetic sub-layer comprises an alloy belonging to the A or B group which is the same as that of the free magnetic layer and different from that of the first pinned magnetic sub-layer, or a magnetic material constituting the first pinned magnetic sub-layer comprises an alloy belonging to the A or B group which is the same as that of the free magnetic layer and different from that of the second pinned magnetic sub-layer.

In the magnetic detecting element of the present invention, the free magnetic layer may comprise a first free magnetic sub-layer, a nonmagnetic intermediate layer, a second free magnetic sub-layer, a nonmagnetic intermediate layer and a third free magnetic sub-layer, which are laminated in that order, wherein a magnetic material constituting the first free magnetic sub-layer comprises an alloy belonging to the A or B group which is the same as those of the third free magnetic sub-layer and the pinned magnetic layer and different from that of the second free magnetic sub-layer, or a magnetic material constituting the first free magnetic sub-layer comprises an alloy belonging to the A or B group which is the same as that of the third free magnetic sub-layer and different from those of the second free magnetic sub-layer and the pinned magnetic layer.

In the spin valve magnetic detecting element of the present invention, if the magnetic material constituting each of the magnetic layers is defined, when magnetization of the free magnetic layer is changed to minimize the resistance value, the resistance values for the spin-up conduction electrons are lower than the resistance values for the spin-down conduction electrons in all magnetic layers, or the resistance values for the spin-down conduction electrons are lower than the resistance values for the spin-up conduction electrons in all magnetic layers, thereby increasing the change ΔR in resistance of the magnetic detecting element.

In the present invention, at least one of the nonmagnetic material layer and the nonmagnetic intermediate layer comprises a laminated film of a Cu layer and a Cr layer. When the laminated film is held between a magnetic layer made of an alloy belonging to the A group and a magnetic layer made of an alloy belonging to the B group, the resistance values for the spin-up conduction electrons are lower than the resistance values for the spin-down conduction electrons at all interfaces, or the resistance values for the spin-down conduction electrons are lower than the resistance values for the spin-up conduction electrons at all interfaces, thereby increasing the change ΔR in resistance of the magnetic detecting element.

In the present invention, even when the thicknesses of all of the nonmagnetic intermediate layer, the first free magnetic sub-layer and the nonmagnetic material layer are smaller than the spin diffusion lengths of the materials constituting the respective layers, the change ΔR in resistance of the magnetic detecting element can be increased.

Also, even when the thicknesses of all of the free magnetic layer, the nonmagnetic material layer, the second pinned magnetic sub-layer and the nonmagnetic intermediate material layer are smaller than the spin diffusion lengths of the materials constituting the respective layers, the change ΔR in resistance of the magnetic detecting element can be increased.

Furthermore, even when the thicknesses of all of the nonmagnetic intermediate layer, the second free magnetic sub-layer, the nonmagnetic material layer, the first fee magnetic layer and the nonmagnetic material layer are smaller than the spin diffusion lengths of the materials constituting the respective layers, the change ΔR in resistance of the magnetic detecting element can be increased.

BRIEF DESCRIPTION OF THE DRAWINGS

FIG. 8 is a diagram showing examples of a combination of β of a magnetic layer and γ at an interface between a magnetic layer and a nonmagnetic material layer in a magnetic detecting element of the present invention;

FIG. 9 is a diagram showing examples of a combination of β of a magnetic layer and γ at an interface between a magnetic layer and a nonmagnetic material layer in a magnetic detecting element of the present invention;

DESCRIPTION OF THE PREFERRED EMBODIMENTS

Figure 1:
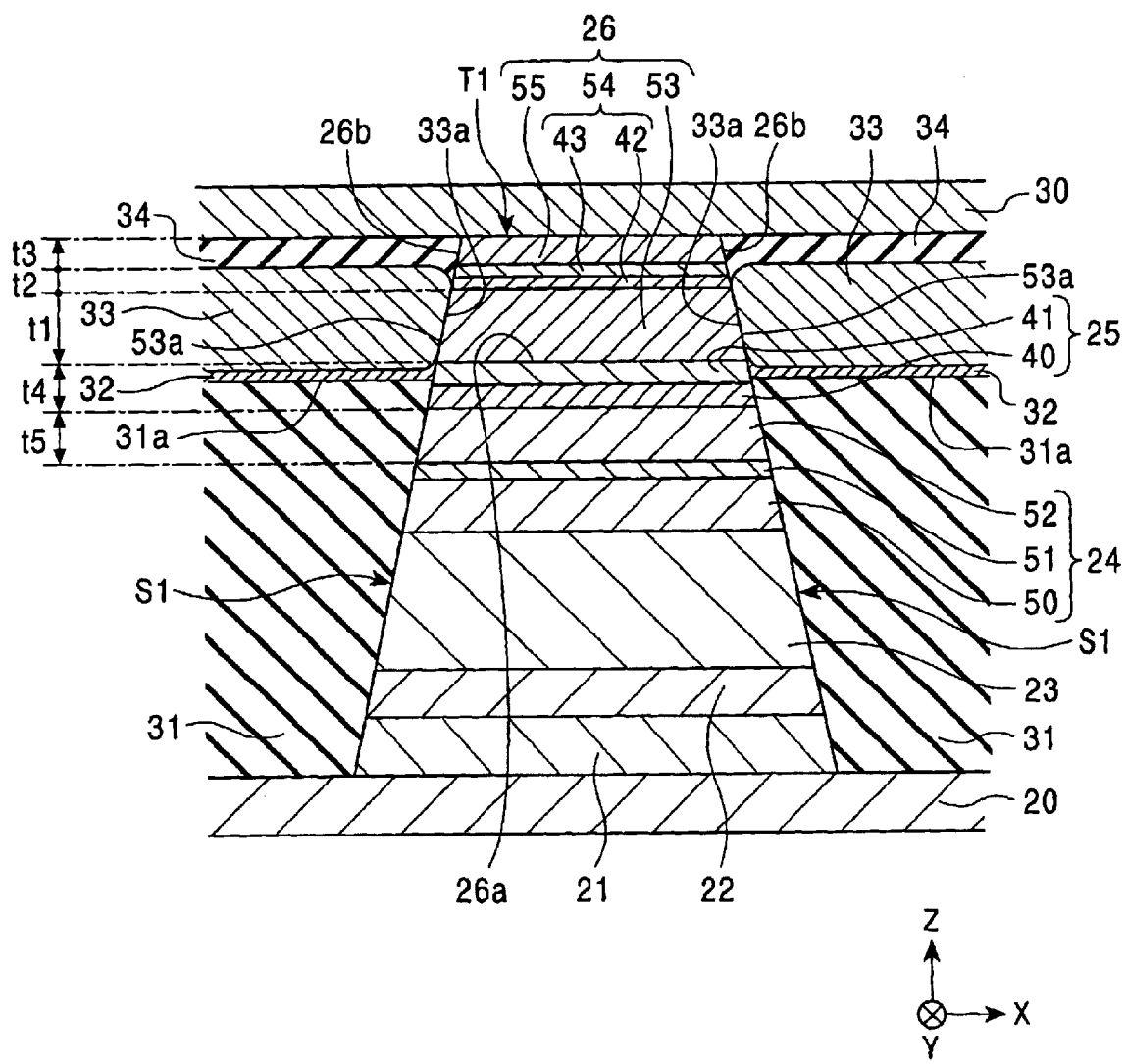
FIG. 1 is a sectional view of a magnetic detecting element according to a first embodiment of the present invention, as viewed from a side facing a recording medium.

FIG. 1 is a partial sectional view of the structure of a magnetic detecting element according to a first embodiment of the present invention, as viewed from a side facing a recording medium.

The magnetic detecting element shown in FIG. 1 is a so-called single-type spin valve thin film element.

In the magnetic detecting element, an underlying layer 21, a seed layer 22, an antiferromagnetic layer 23, a pinned magnetic layer 24 having a three-layer ferrimagnetic structure comprising a first pinned magnetic sub-layer 50, a second pinned magnetic sub-layer 52 and a nonmagnetic intermediate layer 51 formed therebetween and made of Ru, a nonmagnetic material layer 25 and a free magnetic layer 26 are formed on the center of the top of a first electrode layer 20 in that order from the bottom. The free magnetic layer 26 has a three-layer ferrimagnetic structure comprising a first free magnetic sub-layer 53, a second free magnetic sub-layer 55 and a nonmagnetic intermediate layer 54 formed therebetween.

Each of the first electrode layer 20 and second electrode layer 30 is made of, for example, α-Ta, Au, Cr, Cu (copper), W (tungsten), or the like. The underlying layer 21 is preferably made of at least one of Ta, Hf, Nb, Zr, Ti, Mo, and W. The underlying layer 21 is formed to a thickness of about 50 Å or less. However, the underlying layer 21 is not necessarily formed.

The seed layer 22 is mainly composed of a face-centered cubic crystal in which a (111) plane is preferentially oriented in parallel to the interface with the antiferromagnetic layer 23 described below. The seed layer 22 is preferably made of Cr, a NiFe alloy, or a Ni—Fe—Y alloy (wherein Y is at least one element selected from Cr, Rh, Ta, Hf, Nb, Zr, and Ti). When the seed layer 22 made of such a material is formed on the underlying layer 21 made of Ta or the like, the (111) plane is easily preferentially oriented in parallel to the interface with the antiferromagnetic layer 23. The seed layer 23 is formed to a thickness of, for example, about 30 Å.

The magnetic detecting element of the present invention is a CPP type in which a sensing current flows perpendicularly to the film plane of each layer, and thus the sensing current must be appropriately flowed through the seed layer 22. Therefore, the seed layer 22 is preferably made of a material having low resistivity. Namely, in the CPP type, the seed layer 22 is preferably made of a material having low resistivity, such as a NiFe alloy or the like. However, the seed layer 22 is not necessarily formed.

The antiferromagnetic layer 23 is preferably made of an antiferromagnetic material containing Mn and an element X (wherein X is at least one element selected from Pt, Pd, Ir, Rh, Ru, and Os), or an antiferromagnetic material containing Mn and elements X and X (wherein X' is at least one element of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and the rare earth elements).

These antiferromagnetic materials have excellent corrosion resistance and a high blocking temperature, and produce a large exchange anisotropic magnetic field at the interface with the pinned magnetic layer 24 which will be described below. The antiferromagnetic layer 23 is preferably formed to a thickness of 80 Å to 300 Å, for example, 200 Å.

In this embodiment, the pinned magnetic layer 24 has the three-layer ferrimagnetic structure.

The pinned magnetic layer 24 comprises the two magnetic layers 50 and 52, and the nonmagnetic intermediate layer 51 made of a nonmagnetic material and interposed between the first and second magnetic layers 50 and 52. The materials for the pinned magnetic layer 24 will be described below.

An exchange anisotropic magnetic field occurs between the antiferromagnetic layer 23 and the first pinned magnetic sub-layer 50.

For example, when magnetization of the first pinned magnetic sub-layer 50 is pinned in a direction opposite to the height direction (the Y direction shown in the drawing), the second pinned magnetic sub-layer 52 is magnetized in the height direction by a RKKY interaction. In this construction, magnetization of the pinned magnetic layer 24 can be stabilized, and the magnetization direction of the pinned magnetic layer 24 can be strongly pinned.

For example, each of the first and second pinned magnetic sub-layers 50 and 52 is formed to a thickness of about 10 Å to 70 Å, and each of the nonmagnetic intermediate layer 51 and the intermediate layer 61 is formed to a thickness of about 3 Å to 10 Å.

The pinned magnetic layer 24 may be formed in a single film or a laminated film comprising only magnetic layers instead of the ferrimagnetic structure.

The nonmagnetic material layer 25 is made of an electrically conductive material having a low electric resistance. The nonmagnetic material layer 25 is formed to a thickness of, for example, about 25 Å. The nonmagnetic material layer 25 has a two-layer structure comprising a laminate of first and second layers 40 and 41. The materials for the nonmagnetic material layer 25 will be described below.

The free magnetic layer 26 has the three-layer ferrimagnetic structure comprising the first free magnetic sub-layer 53, the second free magnetic sub-layer 55, and the nonmagnetic intermediate layer 54 formed therebetween.

Each of the first and second free magnetic sub-layers 53 and 55 is made of a magnetic material, and the nonmagnetic intermediate layer 54 is made of a nonmagnetic material. Magnetization of one of the first and second free magnetic sub-layers 53 and 55, which has a larger magnetic thickness (magnetic moment per unit area: saturation magnetic flux density Ms×thickness t), is aligned in the X direction by a longitudinal bias magnetic field from each hard bias layer 33 which is magnetized in the track width direction (the X direction), and magnetization of the other free magnetic layer is aligned antiparallel to the X direction shown in the drawing.

For example, in FIG. 1, the magnetic thickness of the first free magnetic sub-layer 53 is larger than that of the second free magnetic sub-layer 55, and thus the magnetization of the first free magnetic sub-layer 53 is aligned in the X direction. The magnetization direction of the second free magnetic sub-layer 55 is aligned antiparallel to the X direction shown in the drawing by the RKKY interaction.

The total magnetic thickness of the free magnetic layer 26 is equal to a difference between the magnetic thickness of the first free magnetic sub-layer 53 and the magnetic thickness of the second free magnetic sub-layer 55. Therefore, in the synthetic ferrimagnetic free magnetic layer 26 of this embodiment, even when each of the first free magnetic sub-layer 53 and the second free magnetic sub-layer 55 is formed to a thickness which allows stable deposition, the effective magnetic thickness of the free magnetic layer 26 can be decreased, and the magnetic field detecting sensitivity of the magnetic detecting element can be improved.

The materials and thicknesses of the first free magnetic sub-layer 53, the second free magnetic sub-layer 55 and the nonmagnetic intermediate layer 54 will be described below.

As shown in FIG. 1, insulating layers 31 are formed on the first electrode layer 20 and on both sides of the multilayer film T1 in the track width direction. Each of the insulating layers 31 is made of a general insulating material, for example, $Al_2O_3$, $SiO_2$, or the like.

In FIG. 1, the tops 31a of the insulating layers 31 are preferably below (in the direction opposite to the Z direction shown in FIG. 1) the bottoms 26a of the free magnetic layer 26.

Also, bias underlying layers 32 are formed on the respective insulating layers 31. Furthermore, the hard bias layers 33 are formed on the respective bias underlying layers 32. The hard bias layers 33 are formed at positions facing both end surfaces 26b of the free magnetic layer 26. The hard bias layers 33 are magnetized in the track width direction (the X direction shown in the drawing).

The bias underlying layers 32 are provided for improving the characteristics (coercive force Hc and remanence ratio S) of the hard bias layers 33.

In the present invention, each of the bias underlying layers 32 preferably comprises a metal film having a body-centered cubic crystal structure (bcc structure). Also, each of the bias underlying layers 32 has a crystal orientation in which a (100) plane is preferentially oriented.

Each of the hard bias layers 33 is made of a CoPt alloy, a CoPtCr alloy, or the like. The alloy has a crystal structure comprising a single phase of a hexagonal close-packed structure (hcp) or a mixed phase of a face-centered cubic structure (fcc) and a hexagonal close-packed structure (hcp).

Since the atomic arrangement of each bias underlying layer 32 comprising the metal film is close to that of the hcp structure CoPt alloy constituting each hard bias layer 33 at the interface therebetween, the CoPt alloy is easily formed in the hcp structure, not the fcc structure. In the hcp structure, a c axis is preferentially oriented within the interface between the CoPt alloy and each bias underlying layer 32. The hcp structure produces large magnetic anisotropy in the c axis direction as compared with the fcc structure, and thus the coercive force Hc is increased when a magnetic field is applied to the hard bias layers 33. Furthermore, since the c axis of the hcp structure is preferentially oriented within the interface between the CoPt alloy and each bias underlying layer 32, residual magnetization is increased to increase the remanence ratio S determined by residual magnetization/saturation magnetic flux density. As a result, the characteristics of the hard bias layers 33 can be improved, and a bias magnetic field produced from each hard bias layer 33 can be increased. The metal film having a body-centered cubic crystal structure (bcc structure) is preferably composed of at least one element of Cr, W, Mo, V, Mn, Nb, and Ta.

Although the bias underlying layers 32 are preferably formed only below the respective hard bias layers 33, the bias underlying layer 32 may be slightly provided between both end surfaces 26b of the free magnetic layer 26 and the hard bias layers 33. Each of the hard bias layers 32 formed between both end surfaces 26b of the free magnetic layer 26 and the hard bias layers 33 preferably has a thickness of 1 nm or less in the track width direction (the X direction)

Therefore, the hard bias layers 33 can be magnetically connected to the free magnetic layer 26 to prevent the problem of a buckling phenomenon in which the ends of the free magnetic layer 26 are influenced by a demagnetizing field, thereby facilitating domain control of the free magnetic layer 26.

In the magnetic detecting element shown in FIG. 1, the first and second free magnetic sub-layers 53 and 55 of the free magnetic layer 26 are put into a single magnetic domain state by the hard bias layers 33. However, in this embodiment in which the magnetization directions of the first and second free magnetic sub-layers 53 and 55 are antiparallel to each other, the inner end surfaces 33a of the hard bias layers 33 preferably face only the ends of one of the first and second free magnetic sub-layers 53 and 55.

In FIG. 1, the inner ends 33a of the hard bias layers 33 face only the ends 53a of the first free magnetic sub-layer 53. Therefore, a longitudinal bias magnetic field in the track width direction (the X direction) supplied from each hard bias layer 33 is applied directly to only the first free magnetic sub-layer 53, thereby suppressing or preventing the occurrence of a disturbance in magnetization of the second free magnetic sub-layer 55 having the magnetization direction antiparallel to the track width direction.

As shown in FIG. 1, insulating layers 34 are formed on the respective hard bias layer 33. Each of the insulating layers 34 is made of a general insulating material such as $Al_2O_3$, SiO2, or the like. In this embodiment, the top surfaces of the insulating layers 34 and the top surface of the free magnetic layer 26 are formed in a continuous surface.

Furthermore, the second electrode layer 30 is formed on the insulating layers 34 and the free magnetic layer 26.

Although, in this embodiment, the sensing current flows from the second electrode layer 30 to the first electrode layer 20, the sensing current may flow from the first electrode layer 20 to the second electrode layer 30. Thus, the sensing current flows perpendicularly to the film plane of each of the layers of the magnetic detecting element. This flow direction of the sensing current is referred to as the "CPP type".

When the sensing current is supplied to the free magnetic layer 26, the nonmagnetic material layer 25 and the pinned magnetic layer 24, and a leakage magnetic field is applied in the Y direction from the recording medium such as a hard disk or the like which moves in the Z direction, the magnetization direction of the free magnetic layer 26 is changed from the X direction to the Y direction. Therefore, the electric resistance is changed based on a relation between the magnetization directions of the first free magnetic sub-layer 53 and the second pinned magnetic sub-layer 52 (magnetoresistive effect), and the leakage magnetic field is detected by a voltage change or current change based on the change in the electric resistance.

In the magnetic detecting element shown in FIG. 1, the multilayer film T1 comprising the underlying layer 21, the seed layer 22, the antiferromagnetic layer 23, the pinned magnetic layer 24, the nonmagnetic material layer 25, and the free magnetic layer 26 has both continuous end surfaces S1 in the track width direction (the X direction).

The characteristics of the magnetic detecting element shown in FIG. 1 will be described.

The magnetic detecting element of this embodiment is characterized in that the material used for forming each of the pinned magnetic layer 24, the nonmagnetic material layer 25 and the free magnetic layer 26 is appropriately selected based on specified conditions of the present invention to improve the change ΔR in resistance.

In the magnetic detecting element shown in FIG. 1, the material of each of the pinned magnetic layer 24, the nonmagnetic material layer 25 and the free magnetic layer 26 is as follows.

Case 1: Each of the second free magnetic sub-layer 55 and the second pinned magnetic sub-layer 52 of the pinned magnetic layer 24 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

The first free magnetic sub-layer 53 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and W).

The nonmagnetic material layer 25 comprises a laminate of the first and second layers 40 and 41 which are composed of Cu and Cr, respectively. The nonmagnetic intermediate layer 54 of the free magnetic layer 26 also comprises a laminate of the first and second layers 42 and 43 which are composed of Cr and Cu, respectively.

Case 2: Each of the second free magnetic sub-layer 55 and the second pinned magnetic sub-layer 52 of the pinned magnetic layer 24 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and W).

The first free magnetic sub-layer 53 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

The nonmagnetic material layer 25 comprises a laminate of the first and second layers 40 and 41 which are composed of Cr and Cu, respectively. The nonmagnetic intermediate layer 54 of the free magnetic layer 26 also comprises a laminate of the first and second layers 42 and 43 which are composed of Cu and Cr, respectively.

The first pinned magnetic sub-layer 50 of the pinned magnetic layer 24 is made of the same material as that of the second pinned magnetic sub-layer 52.

Assuming that the NiX alloy, the CoT alloy, the FeZ alloy and the Co—Mn-D alloy are alloys belonging to an A group, and the NiM alloy, the CoQ alloy and the FeA alloy are alloys belonging to a B group, an alloy belonging to the A group is a magnetic material having $\beta>0$, and an alloy belonging to the B group is a magnetic material having $\beta<0$. An example of the NiX alloy is a $Ni_{80}Fe_{20}$ alloy, and an example of the FeA alloy is a $Fe_{90}Cr_{10}$ alloy.

$\beta$ is a value inherent to a magnetic material satisfying the relational expression, $\rho\downarrow/\rho\uparrow=(1+\beta)/(1-\beta)(-1\leq\beta\leq1)$ (wherein $\rho\downarrow$ a resistivity value for the minority conduction electrons, and $\rho\uparrow$ is a resistivity value for the majority conduction electrons). Namely, when the $\beta$ value of the magnetic material is positive ($\beta>0$), $\rho\downarrow>\rho\uparrow$ is established, and thus the majority conduction electrons easily flow through the magnetic material. On the other hand, when the $\beta$ value of the magnetic material is negative ($\beta<0$), $\rho\downarrow<\rho\uparrow$ is established, and thus the minority conduction electrons easily flow through the magnetic material.

Also, at the interface between the second pinned magnetic sub-layer 52 of the pinned magnetic layer 24 and the nonmagnetic material layer 25, the interface between the nonmagnetic material layer 25 and the first free magnetic sub-layer 53, the interface between the first free magnetic sub-layer 53 and the nonmagnetic intermediate layer 54, and the interface between the nonmagnetic intermediate layer 54 and the second free magnetic sub-layer 55, the positive or negative sign of γ is the same as that of β of the magnetic layer in contact with each interface.

γ is a value inherent to an interface satisfying the relational expression, $r\downarrow/r\uparrow=(1+\gamma)/(1-\gamma)(-1\leq\gamma\leq1)$ (wherein $r\downarrow$ is an interface resistance value for the minority conduction electrons, and $r\uparrow$ is an interface resistance value for the majority conduction electrons). Namely, when the γ value is positive (γ>0), $r\downarrow>r\uparrow$ is established, and thus the majority conduction electrons easily flow at the interface. On the other hand, when the γ value is negative (γ<0), $r\downarrow<r\uparrow$ is established, and thus the minority conduction electrons easily flow at the interface.

When a current flows through a conductive material, a spin direction is changed by a movement of a conduction electron for a predetermined distance. A distance of movement of a conduction electron in a conductive material without a change in the spin direction is referred to as a "Spin Diffusion Length". The spin diffusion length is a specific value according to a conductive material.

In this embodiment, all the thickness t1 of the first free magnetic sub-layer 53, the thickness t2 of the nonmagnetic intermediate layer 54, the thickness t3 of the second free magnetic sub-layer 55, the thickness t4 of the nonmagnetic material layer 25, and the thickness t5 of the second pinned magnetic sub-layer 52 are smaller than the spin diffusion lengths of the materials constituting the respective layers.

Therefore, for example, when the spin-up conduction electrons are involved in the magnetoresistive effect, the spin-up conduction electrons flow through the second free magnetic sub-layer 55, the nonmagnetic intermediate layer 54, the first free magnetic sub-layer 53, the nonmagnetic material layer 25 and the second pinned magnetic sub-layer 52 while maintaining identify of the spin direction.

For example, the spin diffusion lengths of $Co_{90}Fe_{10}$, $Ni_{80}Fe_{20}$, $Ni_{97}Cr_{3}$, $Fe_{95}Cr_{5}$, $Fe_{80}Cr_{20}$, Cu and Cr are 150 Å, 120 Å, 50 Å, 90 Å, 40 Å, 1000 Å, and 100 Å, respectively.

Figure 2:
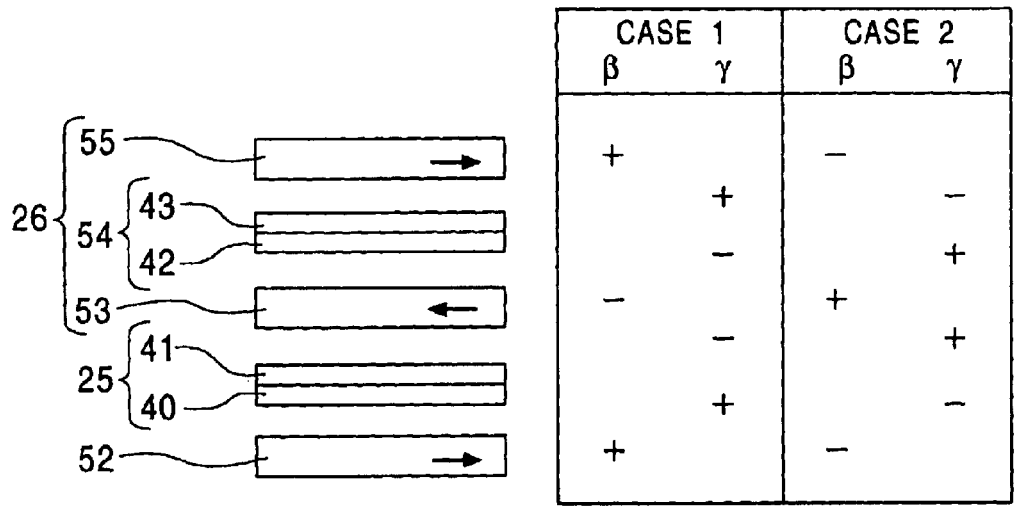
FIG. 2 is a diagram showing examples of a combination of β of a magnetic layer and γ at an interface between a magnetic layer and a nonmagnetic material layer in a magnetic detecting element of the present invention.

FIG. 2 shows a relation between β and γ values and each magnetic layer in the material combination of each of Cases 1 and 2. FIG. 2 schematically shows the layers involved in the magnetoresistive effect of the magnetic detecting element shown in FIG. 1. In FIG. 2, the magnetization direction of each of the second pinned magnetic sub-layer 52 of the pinned magnetic layer 24 and the first and second free magnetic sub-layers 53 and 55 is shown by an arrow. The majority spin of the electrons concerned in magnetization of a magnetic layer having a rightward magnetization direction in the drawing is spin up, and the majority spin of the electrons concerned in magnetization of a magnetic layer having a leftward magnetization direction in the drawing is spin down. Magnetization of each of the first and second free magnetic sub-layers 53 and 55 is oriented in a direction in which the resistance value of the magnetic detecting element is minimum. In FIG. 2, the resistance value of the magnetic detecting element is minimum when the magnetization directions of the second pinned magnetic sub-layer 52 and the first free magnetic sub-layer 53 are antiparallel to each other.

Referring to FIG. 2, in the material combination of Case 1, the resistance values for the spin-up conduction electrons are lower than the resistance values for the spin-down conduction electrons in all magnetic layers, and the interface resistance values for the spin-up conduction electrons are lower than the interface resistance values for the spin-down conduction electrons at the interfaces between all magnetic layers and the nonmagnetic material layers (the nonmagnetic material layer 25, the nonmagnetic intermediate layer 54, and the second nonmagnetic material layer 27).

In the material combination of Case 2, the resistance values for the spin-down conduction electrons are lower than the resistance values for the spin-up conduction electrons in all magnetic layers, and the interface resistance values for the spin-down conduction electrons are lower than the interface resistance values for the spin-up conduction electrons at the interfaces between all magnetic layers and the nonmagnetic material layers (the nonmagnetic material layer 25 and the nonmagnetic intermediate layer 54).

Therefore, a difference between ease of a conduction electron flow under a low-resistance condition and ease of a conduction electron flow under a high-resistance condition can be increased to increase the change ΔR in resistance.

Also, the pinned magnetic layer 24, the nonmagnetic material layer 25 and the free magnetic layer 26 may be made of the following material combination.

Case 3: The second free magnetic sub-layer 55 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

Each of the first free magnetic sub-layer 53 and the second pinned magnetic sub-layer 52 of the pinned magnetic layer 24 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and W).

The nonmagnetic material layer 25 is composed of Cr. The nonmagnetic intermediate layer 54 of the free magnetic layer 26 comprises a laminate of the first and second layers 42 and 43 which are composed of Cr and Cu, respectively.

Case 4: The second free magnetic sub-layer 55 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and W).

Each of the first free magnetic sub-layer 53 and the second pinned magnetic sub-layer 52 of the pinned magnetic layer 24 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

The nonmagnetic material layer 25 is composed of Cu. The nonmagnetic intermediate layer 54 of the free magnetic layer 26 comprises a laminate of the first and second layers 42 and 43 which are composed of Cu and Cr, respectively.

Figure 3:
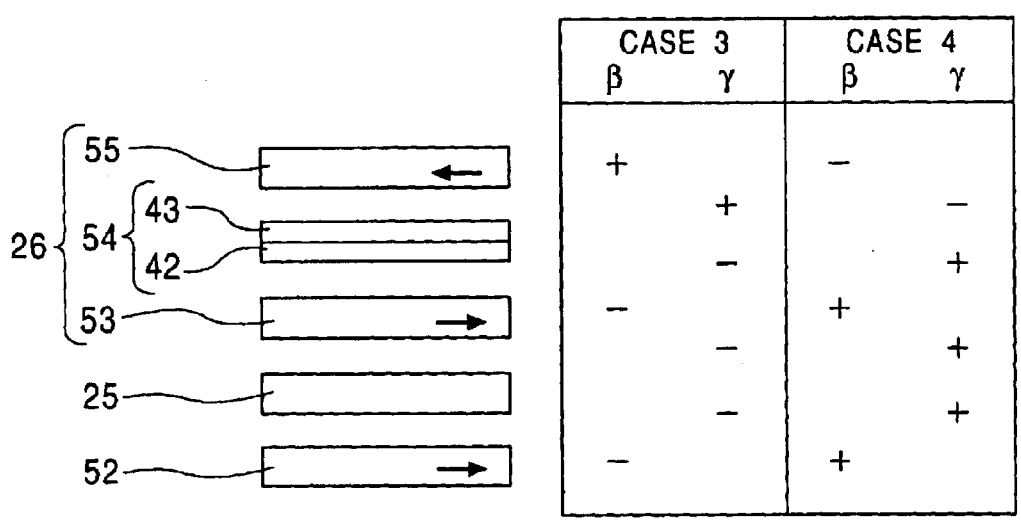
FIG. 3 is a diagram showing examples of a combination of β of a magnetic layer and γ at an interface between a magnetic layer and a nonmagnetic material layer in a magnetic detecting element of the present invention.

FIG. 3 shows a relation between β and γ values and each magnetic layer in the material combination of each of Cases 3 and 4. In FIG. 3, the magnetization direction of each of the second pinned magnetic sub-layer 52 of the pinned magnetic layer 24 and the first and second free magnetic sub-layers 53 and 55 is shown by an arrow. FIG. 3 is different from FIG. 2 in that the nonmagnetic material layer 25 has a single layer structure.

The majority spin of the electrons concerned in magnetization of a magnetic layer having a rightward magnetization direction in the drawing is spin up, and the majority spin of the electrons concerned in magnetization of a magnetic layer having a leftward magnetization direction in the drawing is spin down. Magnetization of each of the first and second free magnetic sub-layers 53 and 55 is oriented in a direction in which the resistance value of the magnetic detecting element is minimum. In FIG. 3, the resistance value of the magnetic detecting element is minimum when the magnetization directions of the second pinned magnetic sub-layer 52 and the first free magnetic sub-layer 53 are parallel to each other.

Referring to FIG. 3, in the material combination of Case 3, the resistance values for the spin-down conduction electrons are lower than the resistance values for the spin-up conduction electrons in all magnetic layers, and the interface resistance values for the spin-down conduction electrons are lower than the interface resistance values for the spin-up conduction electrons at the interfaces between all magnetic layers and the nonmagnetic material layers (the nonmagnetic material layer 25 and the nonmagnetic intermediate layer 54).

In the material combination of Case 4, the resistance values for the spin-up conduction electrons are lower than the resistance values for the spin-down conduction electrons in all magnetic layers, and the interface resistance values for the spin-up conduction electrons are lower than the interface resistance values for the spin-down conduction electrons at the interfaces between all magnetic layers and the nonmagnetic material layers (the nonmagnetic material layer 25 and the nonmagnetic intermediate layer 54).

Therefore, a difference between ease of a conduction electron flow under a low-resistance condition and ease of a conduction electron flow under a high-resistance condition can be increased to increase the change $\Delta R$ in resistance.

In each of Cases 1 to 4, the materials of the second pinned magnetic sub-layer 52 of the pinned magnetic layer 24, the nonmagnetic material layer 25, the first free magnetic sub-layer 53, the nonmagnetic intermediate layer 54 and the second free magnetic sub-layer 55 are selected to control the positive or negative sign of $\beta$ of each layer and the positive or negative sign of $\gamma$ at each interface.

However, in the present invention, the materials of the first pinned magnetic sub-layer 50, the nonmagnetic intermediate layer 51 and the second pinned magnetic sub-layer 52 of the pinned magnetic layer 24, the nonmagnetic material layer 25, and the first free magnetic sub-layer 53 may be selected to control the positive or negative sign of $\beta$ of each layer and the positive or negative sign of $\gamma$ at each interface. In this case, the change $\Delta R$ in resistance of the magnetic detecting element can be increased.

Typical examples of a material combination will be described below.

Case 5: The second pinned magnetic sub-layer 52 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

Each of the first pinned magnetic sub-layer 50 and the first free magnetic sub-layer 53 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and W).

The nonmagnetic intermediate layer 51 of the pinned magnetic layer 24 comprises a laminate of the first and second layers 44 and 45 which are composed of Cr and Cu, respectively. The nonmagnetic material layer 25 also comprises a laminate of the first and second layers 40 and 41 which are composed of Cu and Cr, respectively.

Case 6: The second pinned magnetic sub-layer 52 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or a FeA alloy (wherein A is an element selected from Mn, Cr, V, Ti, Ru, Mo, Os, Re and W).

Each of the first pinned magnetic sub-layer 50 and the first free magnetic sub-layer 53 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

The nonmagnetic intermediate layer 51 of the pinned magnetic layer 24 comprises a laminate of the first and second layers 44 and 45 which are composed of Cu and Cr, respectively. The nonmagnetic material layer 25 also comprises a laminate of the first and second layers 40 and 41 which are composed of Cr and Cu, respectively.

Figure 4:
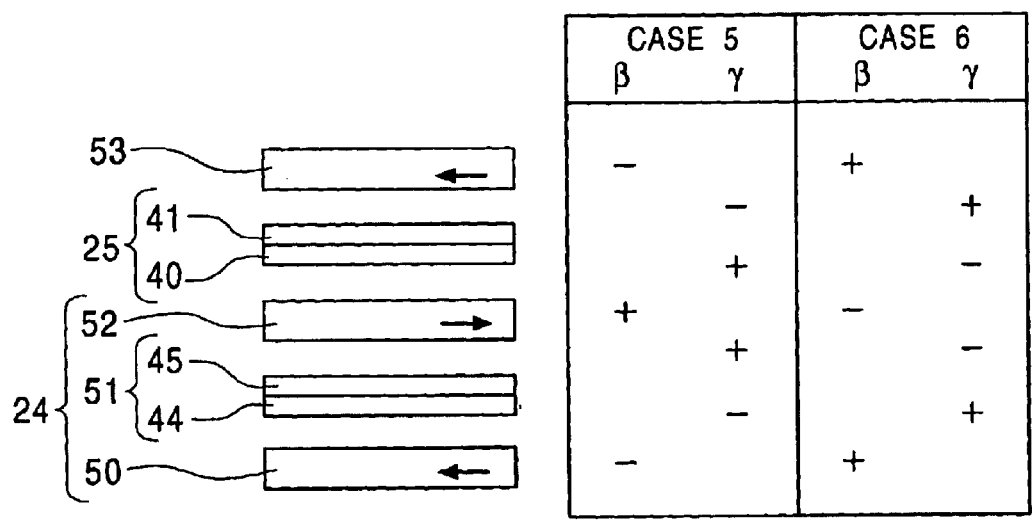
FIG. 4 is a diagram showing examples of a combination of β of a magnetic layer and γ at an interface between a magnetic layer and a nonmagnetic material layer in a magnetic detecting element of the present invention.

FIG. 4 shows a relation between $\beta$ and $\gamma$ values and each magnetic layer in the material combination of each of Cases 5 and 6. In FIG. 4, the magnetization direction of each of the first pinned magnetic sub-layer 50, the second pinned magnetic sub-layer 52, and the first free magnetic sub-layer 53 is shown by an arrow.

The majority spin of the electrons concerned in magnetization of a magnetic layer having a rightward magnetization direction in the drawing is spin up, and the majority spin of the electrons concerned in magnetization of a magnetic layer having a leftward magnetization direction in the drawing is spin down. Magnetization of the first free magnetic sub-layer 53 is oriented in a direction in which the resistance value of the magnetic detecting element becomes minimum. In FIG. 4, the resistance value of the magnetic detecting element is minimum when the magnetization directions of the second pinned magnetic sub-layer 52 and the first free magnetic sub-layer 53 are antiparallel to each other.

Referring to FIG. 4, in the material combination of Case 5, the resistance values for the spin-up conduction electrons are lower than the resistance values for the spin-down conduction electrons in all magnetic layers, and the interface resistance values for the spin-up conduction electrons are lower than the interface resistance values for the spin-down conduction electrons at the interfaces between all magnetic layers and the nonmagnetic material layers (the nonmagnetic intermediate layer 51 and the nonmagnetic material layer 25).

In the material combination of Case 6, the resistance values for the spin-down conduction electrons are lower than the resistance values for the spin-up conduction electrons in all magnetic layers, and the interface resistance values for the spin-down conduction electrons are lower than the interface resistance values for the spin-up conduction electrons at the interfaces between all magnetic layers and the nonmagnetic material layers (the nonmagnetic intermediate layer 51 and the nonmagnetic material layer 25).

Therefore, a difference between ease of a conduction electron flow under a low-resistance condition and ease of a conduction electron flow under a high-resistance condition can be increased to increase the change $\Delta R$ in resistance.

Also, the first pinned magnetic sub-layer 50, the nonmagnetic intermediate layer 51, the second pinned magnetic sub-layer 52, the nonmagnetic material layer 25 and the free magnetic layer 26 may be made of the following material combination.

Case 7: Each of the first free magnetic sub-layer 53 and the second pinned magnetic sub-layer 52 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

The first pinned magnetic sub-layer 50 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and W).

The nonmagnetic intermediate layer 51 of the pinned magnetic layer 24 comprises a laminate of the first and second layers 44 and 45 which are composed of Cr and Cu, respectively. The nonmagnetic material layer 25 is composed of Cu.

Case 8: Each of the first free magnetic sub-layer 53 and the second pinned magnetic sub-layer 52 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and W).

The first pinned magnetic sub-layer 50 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

The nonmagnetic intermediate layer 51 of the pinned magnetic layer 24 comprises a laminate of the first and second layers 44 and 45 which are composed of Cu and Cr, respectively. The nonmagnetic material layer 25 is made of Cr.

Figure 5:
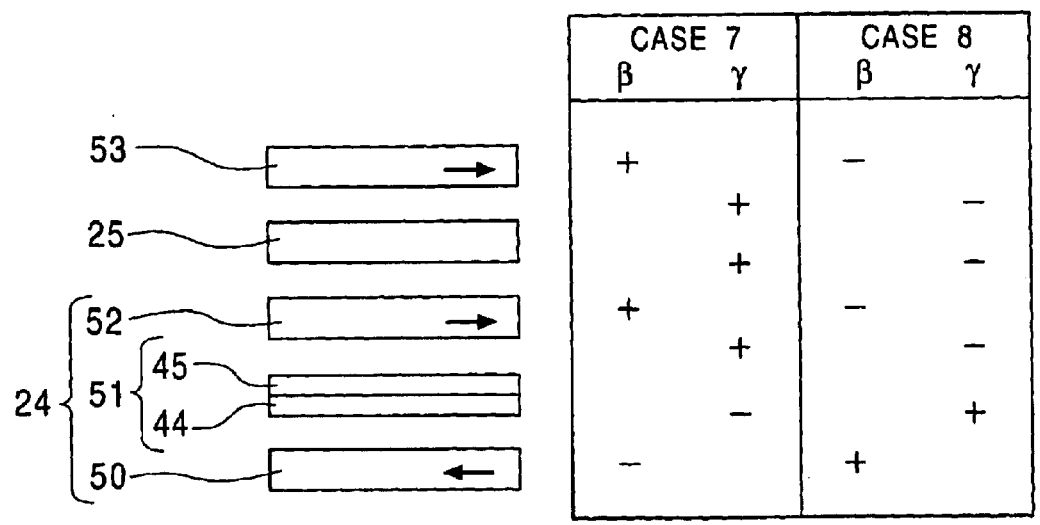
FIG. 5 is a diagram showing examples of a combination of β of a magnetic layer and γ at an interface between a magnetic layer and a nonmagnetic material layer in a magnetic detecting element of the present invention.

FIG. 5 shows a relation between $\beta$ and $\gamma$ values and each magnetic layer in the material combination of each of Cases 7 and 8. In FIG. 5, the magnetization direction of each of the first pinned magnetic sub-layer 50, the second pinned magnetic sub-layer 52, and the first free magnetic sub-layer 53 is shown by an arrow. FIG. 5 is different from FIG. 4 in that the nonmagnetic material layer 25 has a single layer structure.

The majority spin of the electrons concerned in magnetization of a magnetic layer having a rightward magnetization direction in the drawing is spin up, and the majority spin of the electrons concerned in magnetization of a magnetic layer having a leftward magnetization direction in the drawing is spin down. Magnetization of each of the first free and second magnetic layers 53 and 55 is oriented in a direction in which the resistance value of the magnetic detecting element is minimum. In FIG. 5, the resistance value of the magnetic detecting element is minimum when the magnetization directions of the second pinned magnetic sub-layer 52 and the first free magnetic sub-layer 53 are parallel to each other.

Referring to FIG. 5, in the material combination of Case 7, the resistance values for the spin-up conduction electrons are lower than the resistance values for the spin-down conduction electrons in all magnetic layers, and the interface resistance values for the spin-up conduction electrons are lower than the interface resistance values for the spin-down conduction electrons at the interfaces between all magnetic layers and the nonmagnetic material layers (the nonmagnetic intermediate layer 51 and the nonmagnetic material layer 25).

In the material combination of Case 8, the resistance values for the spin-down conduction electrons are lower than the resistance values for the spin-up conduction electrons in all magnetic layers, and the interface resistance values for the spin-down conduction electrons are lower than the interface resistance values for the spin-up conduction electrons at the interfaces between all magnetic layers and the nonmagnetic material layers (the nonmagnetic intermediate layer 51 and the nonmagnetic material layer 25).

Therefore, a difference between ease of a conduction electron flow under a low-resistance condition and ease of a conduction electron flow under a high-resistance condition can be increased to increase the change $\Delta R$ in resistance.

In each of the above-described embodiments, both of the free magnetic layer 26 and the pinned magnetic layer 24 have synthetic ferrimagnetic structures. However, in each of Cases 1 to 4, the pinned magnetic layer 24 may comprise a single layer or a laminate comprising only magnetic layers, and in each of Cases 5 to 8, the free magnetic layer 26 may comprise a single layer or a laminate of only magnetic layers.

Figure 6:
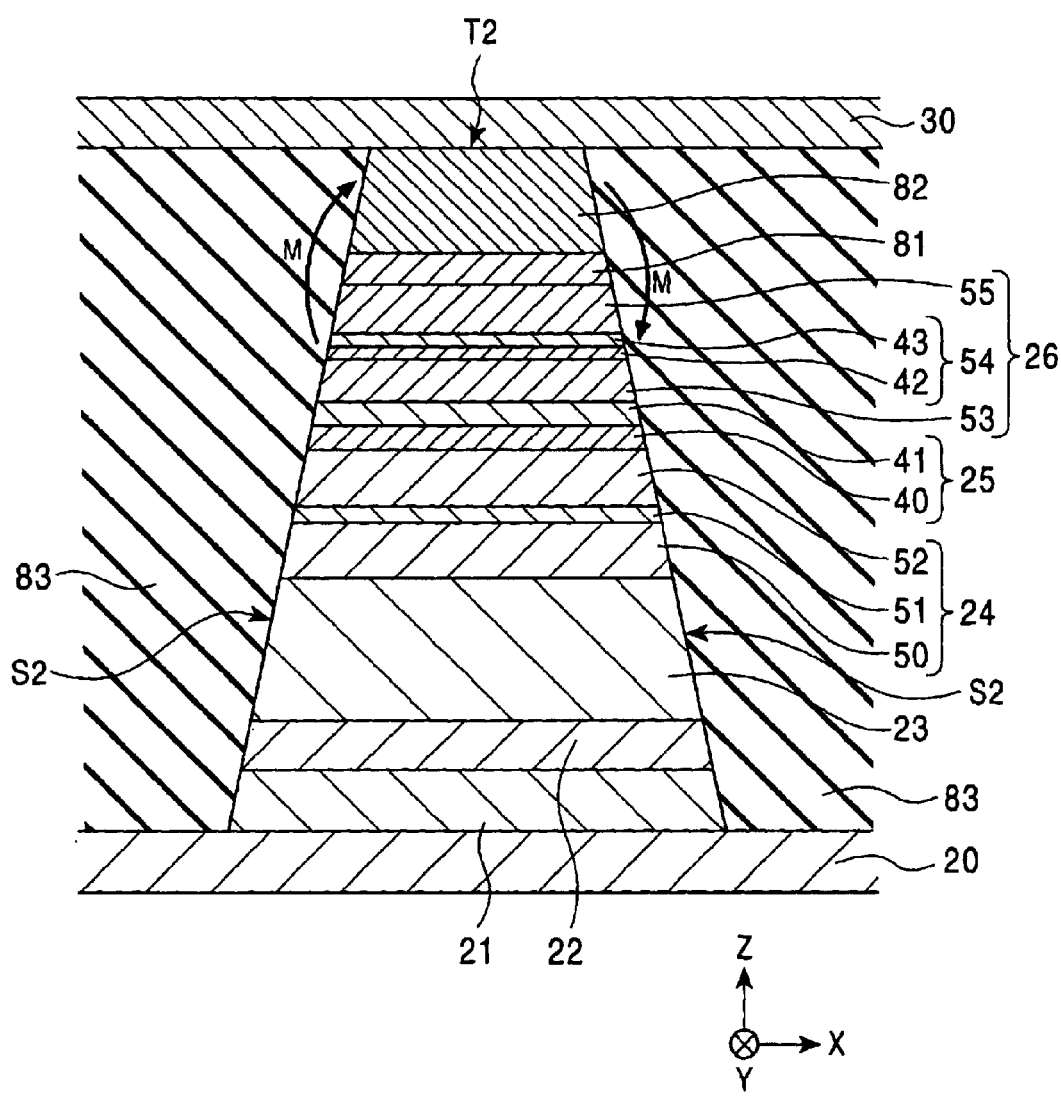
FIG. 6 is a sectional view of a magnetic detecting element according to a second embodiment of the present invention, as viewed from a side facing a recording medium.

FIG. 6 is a partial sectional view of the structure of a magnetic detecting element according to a second embodiment of the present invention, as viewed from a side facing a recording medium.

The magnetic detecting element shown in FIG. 6 is similar to the magnetic detecting element shown in FIG. 1, and is different from the magnetic detecting element shown in FIG. 1 in a system for applying a longitudinal bias to the free magnetic layer 26.

In FIG. 6, a layer denoted by the same reference numeral as in FIG. 1 is the same layer comprising the same material having the same thickness as that shown in FIG. 1 unless otherwise specified.

In the magnetic detecting element shown in FIG. 6, instead of the hard bias layers formed on both sides of the free magnetic layer 26, an in-stack bias layer 82 is formed on the free magnetic layer 26 with an intermediate layer 81 provided therebetween. A multilayer film T2 ranges from the underlying layer 21 to the in-stack bias layer 82.

The in-stack bias layer 82 is made of a hard magnetic material such as CoPt or the like, and magnetized in the X direction shown in the drawing. Also, an underlying layer composed of Cr may be formed between the in-stack bias layer 82 and the intermediate layer 81. The material of the intermediate layer 81 is a nonmagnetic conductive material such as Ta, W, Mo, Cr, Cu, or the like.

In this embodiment, a longitudinal bias magnetic field (static magnetic field) is applied to the free magnetic layer 26 from both ends of the in-stack bias layer 82 (shown by arrows) to align the magnetization direction of the second free magnetic sub-layer 55 of the free magnetic layer 26 in antiparallel to the X direction.

In FIG. 6, the magnetic moment per unit area of the second free magnetic sub-layer 55 is greater than that of the first free magnetic sub-layer 53 so that magnetization of the second free magnetic sub-layer 55 is stabilized in the same direction as the longitudinal bias magnetic field applied from the in-stack bias layer 82.

In the magnetic detecting element comprising the in-stack bias layer 82 shown in FIG. 6, the free magnetic layer 26 is not strongly magnetized to optimize domain control of the free magnetic layer 26, thereby improving a change of magnetization of the free magnetic layer 26 with an external magnetic field. Also, insulating layers 83 each made of alumina or $SiO_2$ are formed on both sides of both end surfaces S2 of the multilayer film T2. Therefore, a shunt loss of a sensing current can be decreased.

Although, in the magnetic detecting element shown in FIG. 6, the in-stack bias layer 82 is formed only on the free magnetic layer 26, an in-stack bias layer may be provided below the lower antiferromagnetic layer 23, or in-stack bias layers may be provided on the free magnetic layer 26 and below the antiferromagnetic layer 23.

However, in order to align the magnetization directions of the first and second free magnetic sub-layers 53 and 55 of the free magnetic layer 26 to be antiparallel to each other, the in-stack bias layer is preferably provided on the free magnetic layer 26 or below the lower antiferromagnetic layer 23. Also, among the first and second free magnetic sub-layers 53 and 55 of the free magnetic layer 26, the free magnetic layer nearer to the in-stack bias layer is preferably formed to a larger thickness.

Figure 7:
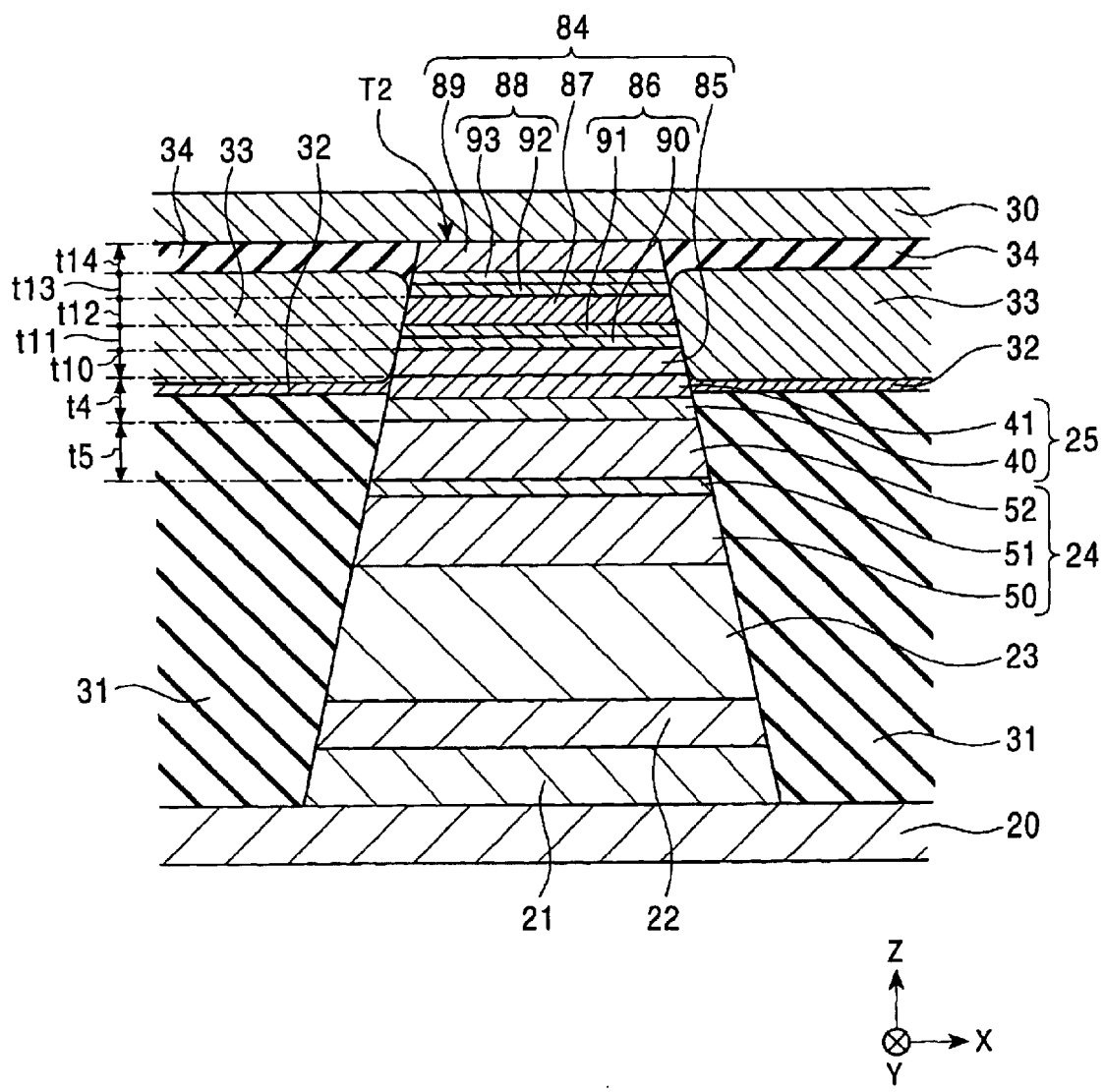
FIG. 7 is a sectional view of a magnetic detecting element according to a third embodiment of the present invention, as viewed from a side facing a recording medium.
Figure 10:
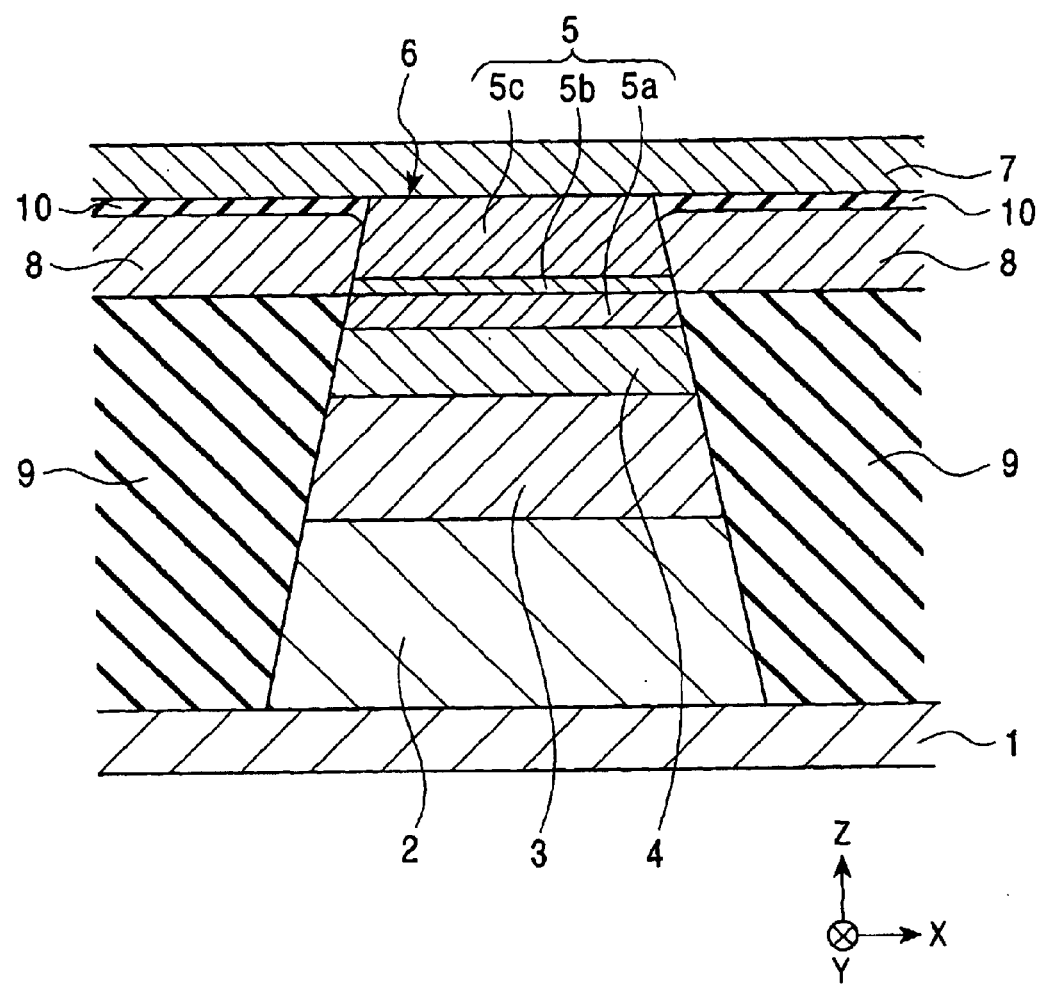
FIG. 10 is a sectional view of a conventional magnetic detecting element, as viewed from a side facing a recording medium.
Figure 11:
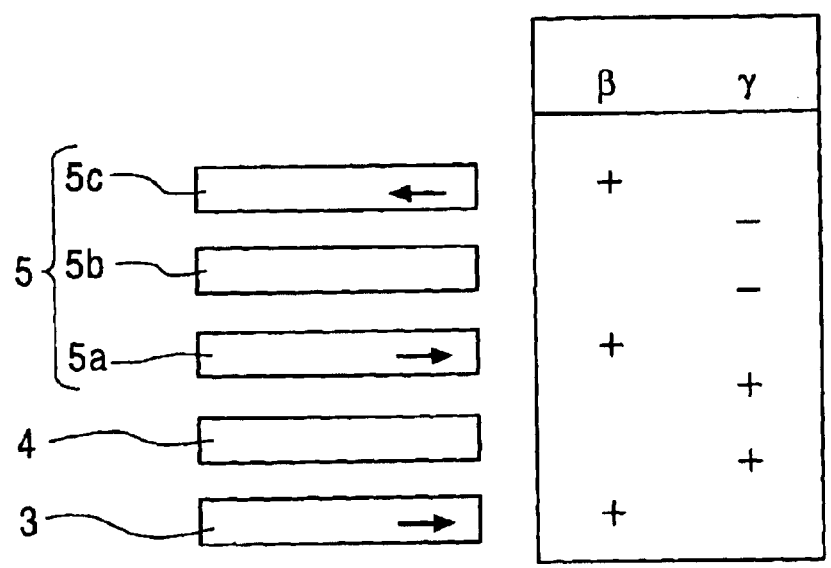
FIG. 11 is a diagram showing examples of a combination of β of a magnetic layer and γ at an interface between a magnetic layer and a nonmagnetic material layer in a conventional magnetic detecting element.

FIG. 7 is a partial sectional view of the structure of a magnetic detecting element according to a third embodiment of the present invention, as viewed from a surface facing a recording medium.

The magnetic detecting element shown in FIG. 7 is similar to the magnetic detecting element shown in FIG. 1, and is different from the magnetic detecting element shown in FIG. 1 in that a free magnetic layer 84 has a three-layer synthetic ferrimagnetic structure.

The free magnetic layer 84 comprises a first free magnetic sub-layer 85, a nonmagnetic intermediate layer 86, a second free magnetic sub-layer 87, a nonmagnetic intermediate layer 88, and a third free magnetic sub-layer 89. The magnetization directions of the first and second free magnetic sub-layers 85 and 87 are antiparallel to each other due to a RKKY interaction through the nonmagnetic intermediate layer 86. Similarly, the magnetization directions of the second and third free magnetic sub-layers 87 and 89 are antiparallel to each other due to a RKKY interaction through the nonmagnetic intermediate layer 88.

With the free magnetic layer 84 having the three-layer synthetic ferrimagnetic structure, a spin flop magnetic field for fixing the magnetization directions of the first, second and third free magnetic sub-layers 85, 87 and 89 antiparallel to each other is twice or more as large as that for the free magnetic layer 26 having the two-layer ferrimagnetic structure shown in FIG. 6. Therefore, the antiparallel magnetization directions of the first, second and third free magnetic sub-layers 85, 87 and 89 can be prevented from being destroyed by a longitudinal bias magnetic field, and the single domain structure of the entire free magnetic layer can be stabilized to significantly decrease Barkhausen noise.

In the magnetic detecting element shown in FIG. 7, the materials of the pinned magnetic layer 24, the free magnetic layer 84, and the nonmagnetic material layer 25 are as follows.

Case 1: Each of the first free magnetic sub-layer 85 and the third free magnetic sub-layer 89 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

Each of the second free magnetic sub-layer 87 and the second pinned magnetic sub-layer 52 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and W).

The nonmagnetic material layer 25 comprises a laminate of the first and second layers 40 and 41 which are composed of Cr and Cu, respectively. The nonmagnetic intermediate layer 86 of the free magnetic layer 84 comprises a laminate of first and second layers 90 and 91 which are composed of Cu and Cr, respectively. The nonmagnetic intermediate layer 88 also comprises a laminate of first and second layers 92 and 93 which are composed of Cr and Cu, respectively.

Case 2: Each of the first free magnetic sub-layer 85 and the third free magnetic sub-layer 89 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and W).

Each of the second free magnetic sub-layer 87 and the second pinned magnetic sub-layer 52 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

The nonmagnetic material layer 25 comprises a laminate of the first and second layers 40 and 41 which are composed of Cu and Cr, respectively. The nonmagnetic intermediate layer 86 of the free magnetic layer 84 comprises a laminate of the first and second layers 90 and 91 which are composed of Cr and Cu, respectively. The nonmagnetic intermediate layer 88 also comprises a laminate of the first and second layers 92 and 93 which are composed of Cu and Cr, respectively.

The first pinned magnetic sub-layer 50 of the pinned magnetic layer 24 is made of the same material as that of the second pinned magnetic sub-layer 52.

Assuming that the NiX alloy, the CoT alloy, the FeZ alloy and the Co—Mn-D alloy are alloys belonging to an A group, and the NiM alloy, the CoQ alloy and the FeA alloy are alloys belonging to a B group, an alloy belonging to the A group is a magnetic material having β>0, and an alloy belonging to the B group is a magnetic material having β<0. An example of the NiX alloy is a $Ni_{80}Fe_{20}$ alloy, and an example of the FeA alloy is a $Fe_{90}Cr_{10}$ alloy.

β is a value inherent to a magnetic material satisfying the relational expression, $\rho\downarrow/\rho\uparrow=(1+\beta)/(1-\beta)(-1\leq\beta\leq1)$ (wherein ρ↓ a resistivity value for the minority conduction electrons, and ρ↑ is a resistivity value for the majority conduction electrons). Namely, when the β value of the magnetic material is positive (β>0), ρ↓>ρ↑ is established, and thus the majority conduction electrons easily flow through the magnetic material. On the other hand, when the β value of the magnetic material is negative (β<0), ρ↓<ρ↑ is established, and thus the minority conduction electrons easily flow through the magnetic material.

Also, at the interface between the second pinned magnetic sub-layer 52 and the nonmagnetic material layer 25, the interface between the nonmagnetic material layer 25 and the first free magnetic sub-layer 85, the interface between the first free magnetic sub-layer 85 and the nonmagnetic intermediate layer 86, the interface between the nonmagnetic intermediate layer 86 and the second free magnetic sub-layer 87, the interface between the second free magnetic sub-layer 87 and the nonmagnetic intermediate layer 88, and the interface between the nonmagnetic intermediate layer 88 and the third free magnetic sub-layer 89, the positive or negative sign of γ is the same as that of β of the magnetic layer in contact with each interface.

γ is a value inherent to an interface satisfying the relational expression, $r\downarrow/r\uparrow=(1+\gamma)/(1-\gamma)(-1\leq\gamma\leq1)$ (wherein $r\downarrow$ is an interface resistance value for the minority conduction electrons, and $r\uparrow$ is an interface resistance value for the majority conduction electrons). Namely, when the γ value is positive (γ>0), $r\downarrow>r\uparrow$ is established, and thus the majority conduction electrons easily flow at the interface. On the other hand, when the γ value is negative (γ<0), $r\downarrow<r\uparrow$ is established, and thus the minority conduction electrons easily flow at the interface.

When a current flows through a conductive material, a spin direction is changed by the movement of a conduction electron for a predetermined distance. The distance of the movement of a conduction electron in a conductive material without a change in the spin direction is referred to as a "spin diffusion length". The spin diffusion length is a specific value according to an electrically conductive material.

For example, the spin diffusion lengths of $Co_{90}Fe_{10}$, $Ni_{80}Fe_{20}$, $Ni_{97}Cr_{3}$, $Fe_{95}Cr_{5}$, $Fe_{80}Cr_{20}$, Cu and Cr are 150 Å, 120 Å, 50 Å, 90 Å, 40 Å, 1000 Å, and 100 Å, respectively.

In this embodiment, all of the thickness t10 of the first free magnetic sub-layer 85, the thickness t11 of the nonmagnetic intermediate layer 86, the thickness t12 of the second free magnetic sub-layer 87, the thickness t13 of the nonmagnetic material layer 88, the thickness t14 of the third free magnetic sub-layer 89, the thickness t4 of the nonmagnetic material layer 25, and the thickness t5 of the second pinned magnetic sub-layer 52 are smaller than the spin diffusion lengths of the materials constituting the respective layers.

Therefore, for example, when the spin-up conduction electrons are involved in the magnetoresistive effect, the spin-up conduction electrons flow through the second pinned magnetic sub-layer 52, the nonmagnetic material layer 25, the first free magnetic sub-layer 85, the nonmagnetic intermediate layer 86, the second free magnetic sub-layer 87, the nonmagnetic intermediate layer 88 and the third free magnetic sub-layer 89 while maintaining identity of the spin direction.

FIG. 8 shows a relation between β and γ values and each magnetic layer in the material combination of each of Cases 1 and 2. FIG. 8 schematically shows the layers involved in the magnetoresistive effect of the magnetic detecting element shown in FIG. 7. In FIG. 8, the magnetization direction of each of the second pinned magnetic sub-layer 52 of the pinned magnetic layer 24 and the first, second and third free magnetic sub-layers 85, 87 and 89 is shown by an arrow. The majority spin of the electrons concerned in magnetization of a magnetic layer having a rightward magnetization direction in the drawing is spin up, and the majority spin of the electrons concerned in magnetization of a magnetic layer having a leftward magnetization direction in the drawing is spin down. Magnetization of each of the first, second and third free magnetic sub-layers 85, 87 and 89 is oriented in a direction in which the resistance value of the magnetic detecting element is minimum. In FIG. 8, the resistance value of the magnetic detecting element is minimum when the magnetization directions of the second pinned magnetic sub-layer 52 and the first free magnetic sub-layer 85 are antiparallel to each other.

Referring to FIG. 8, in the material combination of Case 1, the resistance values for the spin-down conduction electrons are lower than the resistance values for the spin-up conduction electrons in all magnetic layers, and the interface resistance values for the spin-down conduction electrons are lower than the interface resistance values for the spin-up conduction electrons at the interfaces between all magnetic layers and the nonmagnetic material layers (the nonmagnetic material layer 25, the nonmagnetic intermediate layer 86, and the second intermediate layer 88).

In the material combination of Case 2, the resistance values for the spin-up conduction electrons are lower than the resistance values for the spin-down conduction electrons in all magnetic layers, and the interface resistance values for the spin-up conduction electrons are lower than the interface resistance values for the spin-down conduction electrons at the interfaces between all magnetic layers and the nonmagnetic material layers (the nonmagnetic material layer 25, the nonmagnetic intermediate layer 86, and the nonmagnetic intermediate layer 88).

Therefore, a difference between ease of a conduction electron flow under a low-resistance condition and ease of a conduction electron flow under a high-resistance condition can be increased to increase the change ΔR in resistance.

Also, the pinned magnetic layer 24, the nonmagnetic material layer 25 and the free magnetic layer 84 may be made of the following material combination.

Case 3: Each of the first free magnetic sub-layer 85, the third free magnetic sub-layer 89 and the second pinned magnetic sub-layer 52 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and w).

The second free magnetic sub-layer 87 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

The nonmagnetic material layer 25 is composed of Cr. The nonmagnetic intermediate layer 86 of the free magnetic layer 84 comprises a laminate of the first and second layers 90 and 91 which are composed of Cr and Cu, respectively. The nonmagnetic intermediate layer 88 also comprises a laminate of the first and second layers 92 and 93 which are composed of Cu and Cr, respectively.

Case 4: Each of the first free magnetic sub-layer 85, the third free magnetic sub-layer 89 and the second pinned magnetic sub-layer 52 is made of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), or a Co—Mn-D alloy (wherein D is an element selected from Al, Ga, Si, Ge and Sn).

The second free magnetic sub-layer 87 is made of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), or an FeA alloy (wherein A is an element selected from Mn, Cr, V, Ti, Ru, Mo, Os, Re and W).

The nonmagnetic material layer 25 is composed of Cu. The nonmagnetic intermediate layer 86 of the free magnetic layer 84 comprises a laminate of the first and second layers 90 and 91 which are composed of Cu and Cr, respectively. The nonmagnetic intermediate layer 88 also comprises a laminate of the first and second layers 92 and 93 which are composed of Cr and Cu, respectively.

The first pinned magnetic sub-layer 50 of the pinned magnetic layer 24 is made of the same material as that of the second pinned magnetic sub-layer 52.

FIG. 9 shows a relation between $\beta$ and $\gamma$ values and each magnetic layer in the material combination of each of Cases 3 and 4. In FIG. 9, the magnetization direction of each of the second pinned magnetic sub-layer 52, the first free magnetic sub-layer 85, the second free magnetic sub-layer 87, and the third free magnetic sub-layer 89 is shown by an arrow. FIG. 9 is different from FIG. 8 in that the nonmagnetic material layer 25 has a single layer structure.

The majority spin of the electrons concerned in magnetization of a magnetic layer having a rightward magnetization direction in the drawing is spin up, and the majority spin of the electrons concerned in magnetization of a magnetic layer having a leftward magnetization direction in the drawing is spin down. Magnetization of each of the first, second and third magnetic layers 85, 87 and 89 is oriented in a direction in which the resistance value of the magnetic detecting element is minimum. In FIG. 9, the resistance value of the magnetic detecting element is minimum when the magnetization directions of the second pinned magnetic sub-layer 52 and the first free magnetic sub-layer 85 are parallel to each other.

Referring to FIG. 9, in the material combination of Case 3, the resistance values for the spin-down conduction electrons are lower than the resistance values for the spin-up conduction electrons in all magnetic layers, and the interface resistance values for the spin-down conduction electrons are lower than the interface resistance values for the spin-up conduction electrons at the interfaces between all magnetic layers and the nonmagnetic material layers (the nonmagnetic material layer 25, the nonmagnetic intermediate layer 86 and the nonmagnetic intermediate layer 88).

In the material combination of Case 4, the resistance values for the spin-up conduction electrons are lower than the resistance values for the spin-down conduction electrons in all magnetic layers, and the interface resistance values for the spin-up conduction electrons are lower than the interface resistance values for the spin-down conduction electrons at the interfaces between all magnetic layers and the nonmagnetic material layers (the nonmagnetic material layer 25, the nonmagnetic intermediate layer 86, and the nonmagnetic intermediate layer 88).

Therefore, a difference between ease of a conduction electron flow under a low-resistance condition and ease of a conduction electron flow under a high-resistance condition can be increased to increase the change $\Delta R$ in resistance.

The method of manufacturing the magnetic detecting element shown in FIG. 1 will be described below.

First, the underlying layer 21, the seed layer 22, the antiferromagnetic layer 23, the first pinned magnetic sub-layer 50, the nonmagnetic intermediate layer 51 and the second pinned magnetic sub-layer 52 of the pinned magnetic layer 24, the nonmagnetic material layer 25, and the first free magnetic sub-layer 53, the nonmagnetic intermediate layer 54 and the second free magnetic sub-layer 55 of the free magnetic layer 26 are continuously deposited in solid films on the center of the first electrode layer 20 in that order from the bottom in a vacuum to form the multilayer film T1 having a laminated structure. The material and thickness of each layer are the same as those in the completed magnetic detecting element shown in FIG. 1.

The multilayer film T1 is annealed in a magnetic field in the height direction (the Y direction shown in the drawing) to produce an exchange coupling magnetic field between the antiferromagnetic layer 23 and the first pinned magnetic sub-layer 50 of the pinned magnetic layer 24.

The annealing temperature in the magnetic field is, for example, 270° C., and the magnitude of the magnetic field is as high as 800 kA/m or 8 to 30 kA/m, for example, 24 kA/m.

Next, a leftoff resist layer is formed on the free magnetic layer 26 to cover an area which is the same as or slightly smaller than the optical element area of the magnetic detecting element.

Next, the portions of the multilayer film T1 ranging from the free magnetic layer 26 to the underlying layer 21, which are not covered with the resist layer, are removed by ion milling. As a result, the trapezoidal multilayer film T1 ranging from the underlying layer 21 to the free magnetic layer 26 is left at the center of the top of the first electrode layer 20. Since the materials removed by ion milling partially re-adhere to both end surfaces S1 of the multilayer film T1 after ion milling, the re-adhering materials are preferably removed by side milling.

Next, the insulating layers 31 made of $Al_2O_3$, the bias underlying layers 32 made of Cr, the hard bias layers 33 made of CoPtCr, and the insulating layers 34 made of $Al_2O_3$ are deposited by sputtering on the first electrode layer 20 and on both end surfaces S1 of the multilayer film T1.

The insulating layers 31, the bias underlying layers 32, the hard bias layers 33, and the insulating layer 34 are preferably deposited by sputtering with sputtered particles at substantially a right irradiation angle with the substrate.

After the insulating layers 31, the bias underlying layers 32, the hard bias layers 33, and the insulating layer 34 are deposited on both sides of the multilayer film T1, the resist layer is removed.

Then, the second electrode layer 30 is deposited by sputtering over the insulating layers 34 and the free magnetic layer 26 of the multilayer film T1 to form the magnetic detecting element shown in FIG. 1.

In the above-described embodiments, the positive or negative signs of both $\beta$ and $\gamma$ of each of a magnetic layer and a nonmagnetic material layer are controlled to optimize resistivity and interface resistance for spin-up or spin-down conduction electrons. However, in the present invention, only $\beta$ of a magnetic layer or only $\gamma$ of an interface may be controlled in the same manner as in the embodiments. For example, magnetic layers may be made of the same material combination for $\beta$ as in the embodiments, each nonmagnetic material layer may be made of Cu, and each nonmagnetic intermediate layer may be made of Ru.

In the above embodiments, a CPP type (current perpendicular to the plane) spin valve magnetic detecting element is described, in which the sensing current flows in the thickness direction of each layer. However, the present invention may be applied to a CIP type (current in the plane) spin valve magnetic detecting element in which the sensing current flows in the horizontal direction of each layer.

In the present invention described in detail above, $\beta$ of a magnetic material constituting each of the first free magnetic sub-layer, the second free magnetic sub-layer, the third free magnetic sub-layer, the first pinned magnetic sub-layer and the second pinned magnetic sub-layer (simply referred to as "magnetic layers" hereinafter) is defined so that when magnetization of the free magnetic layer is changed to minimize the resistance value, the resistance values for the spin-up conduction electros are lower than the resistance values of the spin-down conduction electrodes in all magnetic layers, or the resistance values for the spin-down conduction electros are lower than the resistance values of the spin-up conduction electrodes in all magnetic layers, thereby increasing the change ΔR in resistance of the magnetic detecting element.

Furthermore, in the present invention, the negative or positive sign of γ at the interface between the first free magnetic sub-layer, the second free magnetic sub-layer, the third free magnetic sub-layer, the first pinned magnetic sub-layer or the second pinned magnetic sub-layer and the nonmagnetic material layer or the nonmagnetic intermediate layer is made the same as the positive or negative sign of β of the magnetic layer in contact with the interface, so that when magnetization of the free magnetic layer is changed to minimize the resistance value, the interface resistance values for the spin-up conduction electros are lower than the interface resistance values for the spin-down conduction electrodes at all interfaces between the magnetic layers and the nonmagnetic material layers (the nonmagnetic material layer and nonmagnetic intermediate layer), or the interface resistance values for the spin-down conduction electrons are lower than the interface resistance values for the spin-up conduction electrodes at all interfaces, thereby increasing the change ΔR in resistance of the magnetic detecting element.

In order to define γ as described above, in some cases, the positive or negative sign of γ at the interface between the top surface of the nonmagnetic material layer or nonmagnetic intermediate layer and a magnetic layer must be differentiated from the positive or negative sign of γ at the interface between the bottom surface of the nonmagnetic material layer or nonmagnetic intermediate layer and the magnetic layer. However, in the present invention, the nonmagnetic material layer and/or the nonmagnetic intermediate layer is formed to a two-layer structure comprising different nonmagnetic materials, and thus the problem of such a necessity can be resolved.

What is claimed is:

1. A magnetic detecting element comprising:
    a multilayer film comprising an antiferromagnetic layer, a pinned magnetic layer, a nonmagnetic material layer and a free magnetic layer, which are laminated in that order, the free magnetic layer including a first free magnetic sub-layer and a second free magnetic sub-layer laminated on the first free magnetic sub-layer with a nonmagnetic intermediate layer provided therebetween,
    wherein one of:
        a β value of a magnetic material constituting the first free magnetic sub-layer has a positive or negative sign which is the same as that of the pinned magnetic layer and different from that of the second free magnetic sub-layer, and
        a β value of a magnetic material constituting the second free magnetic sub-layer has a positive or negative sign which is the same as that of the pinned magnetic layer, and different from that of the first free magnetic sub-layer, and
    wherein the β value is inherent to a magnetic material satisfying the relational expression, $\rho\downarrow/\rho\uparrow=(1+\beta)/(1-\beta)$ (wherein $\rho\downarrow$ is a resistivity value for minority conduction electrons, and $\rho\uparrow$ is a resistivity value for majority conduction electrons).

2. A magnetic detecting element according to claim 1, wherein thicknesses of all of the nonmagnetic intermediate layer, the first free magnetic sub-layer and the nonmagnetic material layer are smaller than spin diffusion lengths of the materials constituting the respective layers.

3. A magnetic detecting element comprising:
    a multilayer film comprising an antiferromagnetic layer, a pinned magnetic layer, a nonmagnetic material layer and a free magnetic layer, which are laminated in that order, the pinned magnetic layer including a first pinned magnetic sub-layer and a second pinned magnetic sub-layer laminated on the first pinned magnetic sub-layer with a nonmagnetic intermediate layer provided therebetween,
    wherein one of:
        a β value of a magnetic material constituting the second pinned magnetic sub-layer has a positive or negative sign which is the same as that of the free magnetic layer and different from that of the first pinned magnetic sub-layer, and
        a β value of a magnetic material constituting the first pinned magnetic sub-layer has a positive or negative sign which is the same as that of the free magnetic layer, and different from that of the second pinned magnetic sub-layer, and
    wherein the β value is inherent to a magnetic material satisfying the relational expression, $\rho\downarrow/\rho\uparrow=(1+\beta)/(1-\beta)$ (wherein $\rho\downarrow$ is a resistivity value for minority conduction electrons, and $\rho\uparrow$ is a resistivity value for majority conduction electrons).

4. A magnetic detecting element according to claim 3, wherein thicknesses of all of the free magnetic layer, the nonmagnetic material layer, the second pinned magnetic sub-layer and the nonmagnetic intermediate material layer are smaller than spin diffusion lengths of the materials constituting the respective layers.

5. A magnetic detecting element comprising:
    a multilayer film comprising an antiferromagnetic layer, a pinned magnetic layer, a nonmagnetic material layer and a free magnetic layer, which are laminated in that order, the free magnetic layer including a first free magnetic sub-layer, a nonmagnetic intermediate layer, a second free magnetic sub-layer, a nonmagnetic intermediate layer and a third free magnetic sub-layer, which are laminated in that order,
    wherein one of:
        a β value of a magnetic material constituting the first free magnetic sub-layer has a positive or negative sign which is the same as those of the third free magnetic sub-layer and the pinned magnetic layer and different from that of the second free magnetic sub-layer, and
        a β value of a magnetic material constituting the second free magnetic sub-layer has a positive or negative sign which is the same as that of the pinned magnetic layer and different from those of the first free magnetic sub-layer and the third free magnetic sub-layer, and
    wherein the β value is inherent to a magnetic material satisfying the relational expression, $\rho\downarrow/\rho\uparrow=(1+\beta)/(1-\beta)$ (wherein $\rho\downarrow$ is a resistivity value for minority conduction electrons, and $\gamma\uparrow$ is a resistivity value for majority conduction electrons).

6. A magnetic detecting element according to claim 5, wherein thicknesses of all of the nonmagnetic intermediate layer, the second free magnetic sub-layer, the nonmagnetic material layer, the first fee magnetic layer and the nonmagnetic material layer are smaller than spin diffusion lengths of the materials constituting the respective layers.

7. A magnetic detecting element according to claim 1, wherein a γ value at an interface between:
   one of the first free magnetic sub-layer, the second free magnetic sub-layer, the third free magnetic sub-layer, the first pinned magnetic sub-layer and the second pinned magnetic sub-layer and
   one of the nonmagnetic intermediate layer and the nonmagnetic intermediate layer
   has the same positive or negative sign as that of the γ value of the magnetic layer in contact with the interface, and
   wherein the γ value is inherent to an interface satisfying the relational expression, $r\downarrow/r\uparrow=(1+\gamma)/(1-\gamma)(-1\leq\gamma\leq1)$ (wherein $r\downarrow$ is an interface resistance value for the minority conduction electrons, and $r\uparrow$ is an interface resistance value for the majority conduction electrons).

8. A magnetic detecting element according to claim 7, wherein at least one of the nonmagnetic material layer and the nonmagnetic intermediate layer is formed in a two-layer structure comprising different nonmagnetic materials so that γ at an interface between the magnetic layer and a top of one of the nonmagnetic material layer and the nonmagnetic intermediate layer has a different positive or negative sign from that at an interface between the magnetic layer and a bottom of the one of the nonmagnetic material layer and the nonmagnetic intermediate layer.

9. A magnetic detecting element comprising:
   a multilayer film comprising an antiferromagnetic layer, a pinned magnetic layer, a nonmagnetic material layer and a free magnetic layer, which are laminated in that order, the free magnetic layer including a first free magnetic sub-layer and a second free pinned magnetic layer laminated on the first free magnetic sub-layer with a nonmagnetic intermediate layer provided therebetween,
   wherein assuming that an alloy belonging to an A group is one of a NiX alloy (wherein X is an element selected from Ca, Fe, Mn, Zr, Hf, Cu and Au), a CoT alloy (wherein T is an element selected from Fe, Zr, Ta and Hf,), an FeZ alloy (wherein Z is an element selected from Ni, Ca, Rh, Pt, Ir, Be, Al, Si, Ga and Ge), and a Co—Mn-D alloy (wherein D is an element selected from Al, Ga, Si, Ge and Sn), and an alloy belonging to a B group is one of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), and an FaA alloy (wherein A is an element selected from Mn, Cr, V, Ti, Ru, Mo, Os, Re and W), one of: a magnetic material constituting the first free magnetic sub-layer comprises an alloy belonging to the A or B group which is the same as that of the pinned magnetic layer and different from that of the second free magnetic sub-layer, and a magnetic material constituting the second free magnetic sub-layer comprises an alloy belonging to the A or B group which is the same as that of the pinned magnetic layer and different from that of the first free magnetic sub-layer.

10. A magnetic detecting element according to claim 9, wherein thicknesses of all of the nonmagnetic intermediate layer, the first free magnetic sub-layer and the nonmagnetic material layer are smaller than spin diffusion lengths of the materials constituting the respective layers.

11. A magnetic detecting element comprising:
   a multilayer film comprising an antiferromagnetic layer, a pinned magnetic layer, a nonmagnetic material layer and a free magnetic layer, which are laminated in that order, the pinned magnetic layer including a first pinned magnetic sub-layer, and a second pinned magnetic sub-layer laminated on the first pinned magnetic sub-layer with a nonmagnetic intermediate layer provided therebetween,
   wherein assuming that an alloy belonging to an A group is one of a NiX alloy (wherein X is an element selected from Ca, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), and a Co-Mn-D alloy (wherein D is an element selected from Al, Ga, Si, Ge and Sn), and an alloy belonging to a B group is one of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), and an FeA alloy (wherein A is an element selected from Mn, Cr, V, Ti, Ru, Mo, Os, Re and W), one of a magnetic material constituting the second pinned magnetic sub-layer comprises an alloy belonging to the A or B group which is the same as that of the free magnetic layer and different from that of the first pinned magnetic sub-layer, and a magnetic material constituting the first pinned magnetic sub-layer comprises an alloy belonging to the A or B group which is the same as that of the free magnetic layer and different from that of the second pinned magnetic sub-layer.

12. A magnetic detecting element according to claim 11, wherein thicknesses of all of the free magnetic layer, the nonmagnetic material layer, the second pinned magnetic sub-layer and the nonmagnetic intermediate material layer are smaller than spin diffusion lengths of the materials constituting the respective layers.

13. A magnetic detecting element comprising:
   a multilayer film comprising an antiferromagnetic layer, a pinned magnetic layer, a nonmagnetic material layer and a free magnetic layer, which are laminated in that order, the free magnetic layer including a first free magnetic sub-layer, a nonmagnetic intermediate layer, a second free magnetic sub-layer, a nonmagnetic intermediate layer and a third free magnetic sub-layer, which are laminated in that order,
   wherein assuming that an alloy belonging to a A group is one of a NiX alloy (wherein X is an element selected from Co, Fe, Mn, Zr, Hf, Cu and Au), a CoT alloy (wherein T is an element selected from Fe, Zr, Ta and Hf,), an FeZ alloy (wherein Z is an element selected from Ni, Co, Rh, Pt, Ir, Be, Al, Si, Ga and Ge), and a Co—Mn-D alloy (wherein D is an element selected from Al, Ga, Si, Ge and Sn), and an alloy belonging to a B group is one of a NiM alloy (wherein M is an element selected from Cr, Rh, Ru, Mo, Nb, Pt, Ir, Os, Re, W and Ta), a CoQ alloy (wherein Q is an element selected from Mn, Cr, Ru, Mo, Ir, Os, Re and W), and an FeA alloy (wherein A is an element selected from Mn, Cr, V, Ti, Ru, Mo, Os, Re and W), one of: a magnetic material constituting the first free magnetic sub-layer comprises an alloy belonging to the A or B group which is the same as those of the third free magnetic sub-layer and the pinned magnetic layer and different from that of the second free magnetic sub-layer, and a magnetic material constituting the first free magnetic sub-layer comprises an alloy belonging to the A or B group which is the same as that of the third free magnetic sub-layer and different from those of the second pinned magnetic sub-layer and the pinned magnetic layer.

14. A magnetic detecting element according to claim 13, wherein thicknesses of all of the nonmagnetic intermediate layer, the second free magnetic sub-layer, the nonmagnetic material layer, the first fee magnetic layer and the nonmagnetic material layer are smaller than spin diffusion lengths of the materials constituting the respective layers.

15. A magnetic detecting element according to claim 9, wherein at least one of the nonmagnetic material layer and the nonmagnetic intermediate layer comprises a laminated film of a Cu layer and a Cr layer, and the laminated film is held between a magnetic layer made of an alloy belonging to the A group and a magnetic layer made of an alloy belonging to the B group.

16. A magnetic detecting element according to claim 11, wherein at least one of the nonmagnetic material layer and the nonmagnetic intermediate layer-comprises a laminated film of a Cu layer and a Cr layer, and the laminated film is held between a magnetic layer made of an alloy belonging to the A group and a magnetic layer made of an alloy belonging to the B group.

17. A magnetic detecting element according to claim 13, wherein at least one of the nonmagnetic material layer and the nonmagnetic intermediate layer comprises a laminated film of a Cu layer and a Cr layer, and the laminated film is held between a magnetic layer made of an alloy belonging to the A group and a magnetic layer made of an alloy belonging to the B group.

18. A magnetic detecting element according to claim 2, wherein a $\gamma$ value at an interface between:

one of the first free magnetic sub-layer, the second free magnetic sub-layer, the third free magnetic sub-layer, the first pinned magnetic sub-layer and the second pinned magnetic sub-layer and one of the nonmagnetic intermediate layer and the nonmagnetic intermediate layer has the same positive or negative sign as that of the $\gamma$ value of the magnetic layer in contact with the interface, and wherein the $\gamma$ value is inherent to an interface satisfying the relational expression, $r\downarrow/r\uparrow=(1+\gamma)/(1-\gamma)(-1\leq\gamma\leq1)$ (wherein $r\downarrow$ is an interface resistance value for the minority conduction electrons, and $r\uparrow$ is an interface resistance value for the majority conduction electrons).

19. A magnetic detecting element according to claim 18, wherein at least one of the nonmagnetic material layer and the nonmagnetic intermediate layer is formed in a two-layer structure comprising different nonmagnetic materials so that $\gamma$ at an interface between the magnetic layer and a top of one of the nonmagnetic material layer and the nonmagnetic intermediate layer has a different positive or negative sign from that at an interface between the magnetic layer and a bottom of the one of the nonmagnetic material layer and the nonmagnetic intermediate layer.

20. A magnetic detecting element according to claim 3, wherein a $\gamma$ value at an interface between:

one of the first free magnetic sub-layer, the second free magnetic sub-layer, the third free magnetic sub-layer, the first pinned magnetic sub-layer and the second pinned magnetic sub-layer and one of the nonmagnetic intermediate layer and the nonmagnetic intermediate layer has the same positive or negative sign as that of the $\gamma$ value of the magnetic layer in contact with the interface, and wherein the $\gamma$ value is inherent to an interface satisfying the relational expression, $r\downarrow/r\uparrow=(1+\gamma)/(1-\gamma)(-1\leq=\leq1)$ (wherein $r\downarrow$ is an interface resistance value for the minority conduction electrons, and $r\uparrow$ is an interface resistance value for the majority conduction electrons).

21. A magnetic detecting element according to claim 20, wherein at least one of the nonmagnetic material layer and the nonmagnetic intermediate layer is formed in a two-layer structure comprising different nonmagnetic materials so that $\gamma$ at an interface between the magnetic layer and a top of one of the nonmagnetic material layer and the nonmagnetic intermediate layer has a different positive or negative sign from that at an interface between the magnetic layer and a bottom of the one of the nonmagnetic material layer and the nonmagnetic intermediate layer.

22. A magnetic detecting element according to claim 4, wherein a $\gamma$ value at an interface between:

one of the first free magnetic sub-layer, the second free magnetic sub-layer, the third free magnetic sub-layer, the first pinned magnetic sub-layer and the second pinned magnetic sub-layer and one of the nonmagnetic intermediate layer and the nonmagnetic intermediate layer has the same positive or negative sign as that of the $\gamma$ value of the magnetic layer in contact with the interface, and wherein the $\gamma$ value is inherent to an interface satisfying the relational expression, $r\downarrow/r\uparrow=(1+\gamma)/(1-\gamma)(-1\leq\gamma\leq1)$ (wherein $r\downarrow$ is an interface resistance value for the minority conduction electrons, and $r\uparrow$ is an interface resistance value for the majority conduction electrons).

23. A magnetic detecting element according to claim 22, wherein at least one of the nonmagnetic material layer and the nonmagnetic intermediate layer is formed in a two-layer structure comprising different nonmagnetic materials so that $\gamma$ at an interface between the magnetic layer and a top of one of the nonmagnetic material layer and the nonmagnetic intermediate layer has a different positive or negative sign from that at an interface between the magnetic layer and a bottom of the one of the nonmagnetic material layer and the nonmagnetic intermediate layer.

24. A magnetic detecting element according to claim 5, wherein a $\gamma$ value at an interface between:

one of the first free magnetic sub-layer, the second free magnetic sub-layer, the third free magnetic sub-layer, the first pinned magnetic sub-layer and the second pinned magnetic sub-layer and one of the nonmagnetic intermediate layer and the nonmagnetic intermediate layer has the same positive or negative sign as that of the $\gamma$ value of the magnetic layer in contact with the interface, and wherein the $\gamma$ value is inherent to an interface satisfying the relational expression, $r\downarrow/r\uparrow=(1+\gamma)/(1-\gamma)(-1\leq\gamma\leq1)$ (wherein $r\downarrow$ is an interface resistance value for the minority conduction electrons, and $r\uparrow$ is an interface resistance value for the majority conduction electrons).

25. A magnetic detecting element according to claim 24, wherein at least one of the nonmagnetic material layer and the nonmagnetic intermediate layer is formed in a two-layer structure comprising different nonmagnetic materials so that γ at an interface between the magnetic layer and a top of one of the nonmagnetic material layer and the nonmagnetic intermediate layer has a different positive or negative sign from that at an interface between the magnetic layer and a bottom of the one of the nonmagnetic material layer and the nonmagnetic intermediate layer.

26. A magnetic detecting element according to claim 6, wherein a γ value at an interface between:

one of the first free magnetic sub-layer, the second free magnetic sub-layer, the third free magnetic sub-layer, the first pinned magnetic sub-layer and the second pinned magnetic sub-layer and one of the nonmagnetic intermediate layer and the nonmagnetic intermediate layer has the same positive or negative sign as that of the β value of the magnetic layer in contact with the interface, and wherein the γ value is inherent to an interface satisfying the relational expression, $r\downarrow/r\uparrow=(1+\gamma)/(1-\gamma)(-1\leq\gamma\leq1)$ (wherein $r\downarrow$ is an interface resistance value for the minority conduction electrons, and $r\uparrow$ is an interface resistance value for the majority conduction electrons).

27. A magnetic detecting element according to claim 26, wherein at least one of the nonmagnetic material layer and the nonmagnetic intermediate layer is formed in a two-layer structure comprising different nonmagnetic materials so that γ at an interface between the magnetic layer and a top of one of the nonmagnetic material layer and the nonmagnetic intermediate layer has a different positive or negative sign from that at an interface between the magnetic layer and a bottom of the one of the nonmagnetic material layer and the nonmagnetic intermediate layer.

* * * * *

UNITED STATES PATENT AND TRADEMARK OFFICE
CERTIFICATE OF CORRECTION

PATENT NO. : 6,806,804 B2
APPLICATION NO. : 10/641538
DATED : October 19, 2004
INVENTOR(S) : Masamichi Saito et al.

It is certified that error appears in the above-identified patent and that said Letters Patent is hereby corrected as shown below:

Columns 25-26, in claim 1, line 23, immediately before "wherein" insert --(-- (parenthetical).

Column 26, in claim 3, line 23, before "(wherein $p\downarrow$" insert --($-1 \leq \beta \leq 1$)--.

Column 26, in claim 5, line 26, after "electrons, and" delete "$\gamma\uparrow$" and substitute --$\rho\uparrow$-- in its place.

Column 27, in claim 7, line 9, after "as that of the" delete "$\gamma$" and substitute --$\beta$-- in its place.

Column 27, in claim 9, line 12, after "from" delete "Ca" and substitute --Co-- in its place.

Column 27, in claim 9, line 15, after "from Ni," delete "Ca" and substitute --Co-- in its place.

Column 27, in claim 9, line 16, delete "Co—Mn-D" and substitute --Co-Mn-D-- in its place.

Column 27, in claim 9, line 22, before "alloy (wherein" delete "FaA" and substitute --FeA-- in its place.

Column 28, in claim 11, line 12, after "from" delete "Ca" and substitute --Co-- in its place.

Column 28, in claim 13, line 16, before "alloy (wherein" delete "Co—Mn-D" and substitute --Co-Mn-D-- in its place.

Column 29, in claim 18, line 9, after "as that of the" delete "$\gamma$" and substitute --$\beta$-- in its place.

Columns 29-30, in claim 20, line 9, after "as that of the" delete "$\gamma$" and substitute --$\beta$-- in its place.

UNITED STATES PATENT AND TRADEMARK OFFICE
CERTIFICATE OF CORRECTION

PATENT NO. : 6,806,804 B2
APPLICATION NO. : 10/641538
DATED : October 19, 2004
INVENTOR(S) : Masamichi Saito et al.

It is certified that error appears in the above-identified patent and that said Letters Patent is hereby corrected as shown below:

In the Claims (cont'd)

Columns 29-30, in claim 20, line 13, delete "(-1 $\leqq=\leqq$ 1)" and substitute --(-$1\leq\gamma\leq1$)-- in its place.

Column 30, in claim 22, line 9, after "as that of the" delete "$\gamma$" and substitute --$\beta$-- in its place.

Column 30, in claim 24, line 9, after "as that of the" delete "$\gamma$" and substitute --$\beta$-- in its place.

Signed and Sealed this

Second Day of January, 2007

JON W. DUDAS
*Director of the United States Patent and Trademark Office*